United States Patent
Woodings et al.

(10) Patent No.: US 8,576,231 B2
(45) Date of Patent: Nov. 5, 2013

(54) SPECTRUM ANALYZER INTERFACE

(71) Applicants: Ryan Woodings, Boise, ID (US); Brian Tuttle, Meridian, ID (US); Don Valate Harrison, Salt Lake City, UT (US)

(72) Inventors: Ryan Woodings, Boise, ID (US); Brian Tuttle, Meridian, ID (US); Don Valate Harrison, Salt Lake City, UT (US)

(*) Notice: Subject to any disclaimer, the term of this patent is extended or adjusted under 35 U.S.C. 154(b) by 0 days.

(21) Appl. No.: 13/654,133

(22) Filed: Oct. 17, 2012

(65) Prior Publication Data

US 2013/0100154 A1    Apr. 25, 2013

Related U.S. Application Data

(63) Continuation of application No. 13/437,168, filed on Apr. 2, 2012, now abandoned, which is a continuation-in-part of application No. 11/605,839, filed on Nov. 28, 2006, now Pat. No. 7,459,898, and a continuation-in-part of application No. 11/973,683, filed on Oct. 9, 2007, now Pat. No. 7,877,698, and a continuation-in-part of application No. 12/220,902, filed on Jul. 28, 2008, now Pat. No. 8,006,195, and a continuation-in-part of application No. 11/973,683, filed on Oct. 9, 2007, and a continuation-in-part of application No. 11/605,839, filed on Nov. 28, 2006, and a continuation of application No. 13/214,359, filed on Aug. 22, 2011, now abandoned.

(60) Provisional application No. 60/740,067, filed on Nov. 28, 2005, provisional application No. 60/809,324, filed on May 30, 2006, provisional application No. 60/850,052, filed on Oct. 6, 2006, provisional application No. 60/962,211, filed on Jul. 27, 2007.

(51) Int. Cl.
*G06T 11/20* (2006.01)

(52) U.S. Cl.
USPC ........ 345/440; 345/440.1; 345/581; 345/589; 345/591; 345/619

(58) Field of Classification Search
None
See application file for complete search history.

(56) References Cited

U.S. PATENT DOCUMENTS

| 4,870,348 A | * | 9/1989 | Smith et al. ............... 324/76.19 |
| 5,177,560 A | | 1/1993 | Stimple et al. |
| 5,760,785 A | | 6/1998 | Barber et al. |

(Continued)

OTHER PUBLICATIONS

Texas Instruments DBB03A, Baseband ASIC for Dolphin Chipset, Data Sheet, SWRS030, Jul. 2005, pp. 1 and 3.

(Continued)

*Primary Examiner* — Kee M Tung
*Assistant Examiner* — Jwalant Amin
(74) *Attorney, Agent, or Firm* — Merchant & Gould P.C.

(57) ABSTRACT

A computer program product stored on a non-transitory computer readable medium usable with a programmable computer, the computer program product having computer-readable code embodied therein for displaying data in a graphical format, the computer-readable code includes, but is not limited to, instructions for mapping a range of detected densities of detected frequency signals to a corresponding range of color hues, generating a spectrum density graph displaying the detected frequency signals and corresponding densities as represented by the mapped corresponding range of color hues, and generating a waterfall spectrum graph displaying the corresponding detected densities utilizing the same color mapping of the detected range of densities of detected frequency signals as utilized by the generated spectrum density graph, thereby providing a density color match between data points on the spectrum density graph and the waterfall spectrum graph.

25 Claims, 30 Drawing Sheets

(56) References Cited

U.S. PATENT DOCUMENTS

| | | |
|---|---|---|
| 6,313,874 B1 | 11/2001 | Bowyer et al. |
| 6,396,517 B1 | 5/2002 | Beck et al. |
| 6,584,413 B1 | 6/2003 | Keenan et al. |
| 6,643,607 B1 | 11/2003 | Chamberlain et al. |
| 6,778,519 B1 | 8/2004 | Harrell et al. |
| 7,295,524 B1 | 11/2007 | Gray et al. |
| 7,459,898 B1 | 12/2008 | Woodings |
| 7,650,589 B2 | 1/2010 | Cifra |
| 7,877,698 B1 | 1/2011 | Woodings et al. |
| 8,006,195 B1 | 8/2011 | Woodings et al. |
| 8,165,808 B2 * | 4/2012 | Scheibe ................. 701/533 |
| 2003/0058243 A1 * | 3/2003 | Faust et al. ............... 345/440 |
| 2004/0023674 A1 | 2/2004 | Miller |
| 2004/0028123 A1 | 2/2004 | Sugar et al. |
| 2004/0047324 A1 | 3/2004 | Diener |
| 2004/0095381 A1 | 5/2004 | McDowell |
| 2004/0167727 A1 | 8/2004 | Pickerd |
| 2005/0113031 A1 | 5/2005 | Turner et al. |
| 2005/0114801 A1 | 5/2005 | Yang et al. |
| 2005/0175079 A1 | 8/2005 | Gamper et al. |
| 2005/0176420 A1 | 8/2005 | Graves et al. |
| 2006/0063523 A1 | 3/2006 | McFarland |
| 2006/0277488 A1 | 12/2006 | Cok et al. |
| 2007/0140424 A1 | 6/2007 | Serceki |
| 2009/0153659 A1 * | 6/2009 | Landwehr et al. ............ 348/135 |
| 2010/0215226 A1 * | 8/2010 | Kaufman et al. ............. 382/128 |
| 2011/0228299 A1 * | 9/2011 | Okumura ....................... 358/1.9 |

OTHER PUBLICATIONS

Cypress Semiconductor Corporation, CYWUSB6935 WirelessUSB™ LR 2.4-GHz DSSS Radio SoC, Document#38-16008 Rev *D, Revised Aug. 3, 2005, p. 1.

* cited by examiner

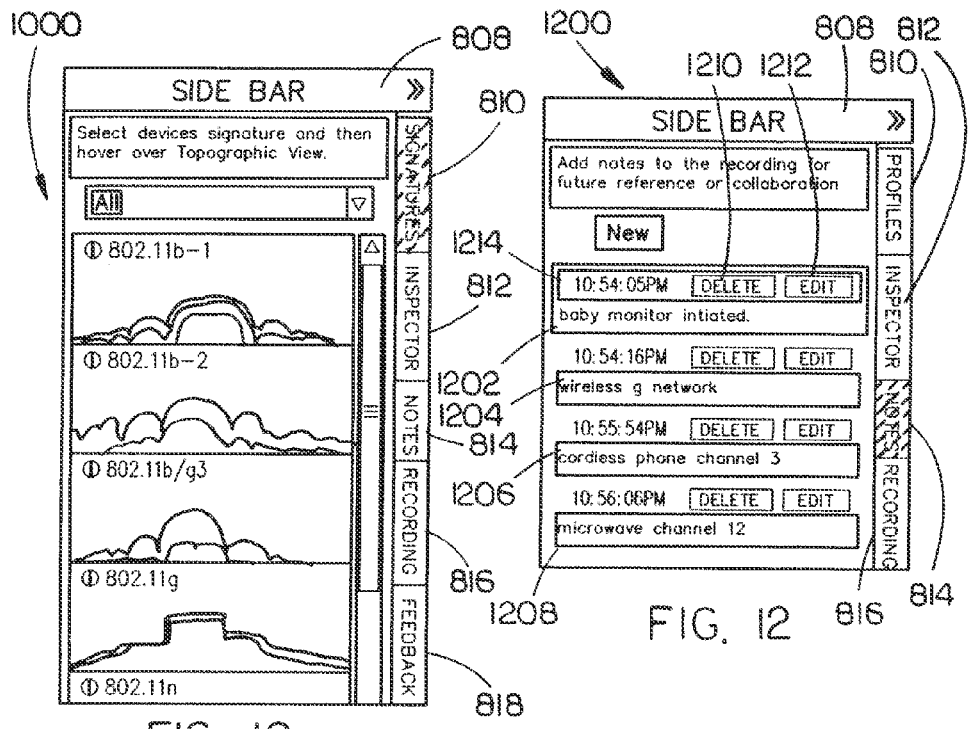
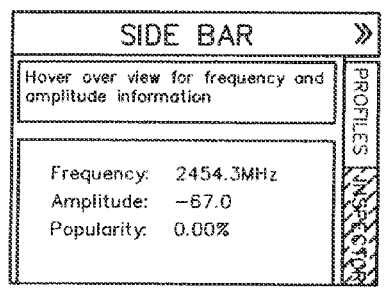
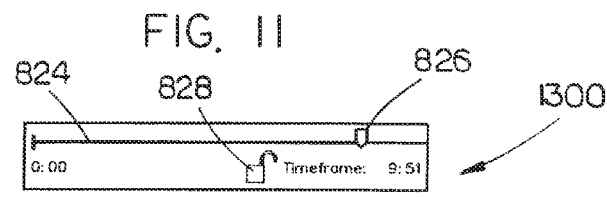
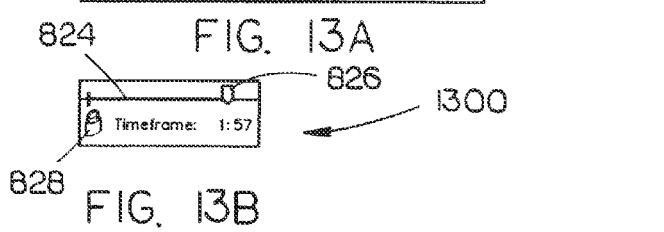

1400

1402
providing a plurality of spectral data display and manipulation options on a display displaying spectral data

1406
providing a region further including a plurality of selectable tabs

1408
providing a tab displaying a signal profile database upon selection

1410
providing a tab generating and displaying a window displaying spectral data at a specific time interval upon selection

1412
providing a tab displaying a window for entering a note upon selection

1414
providing a plurality of enterable fields within the window

1404
displaying a pictorial representation of the spectral data display and manipulation options

FIG. 14A

1400 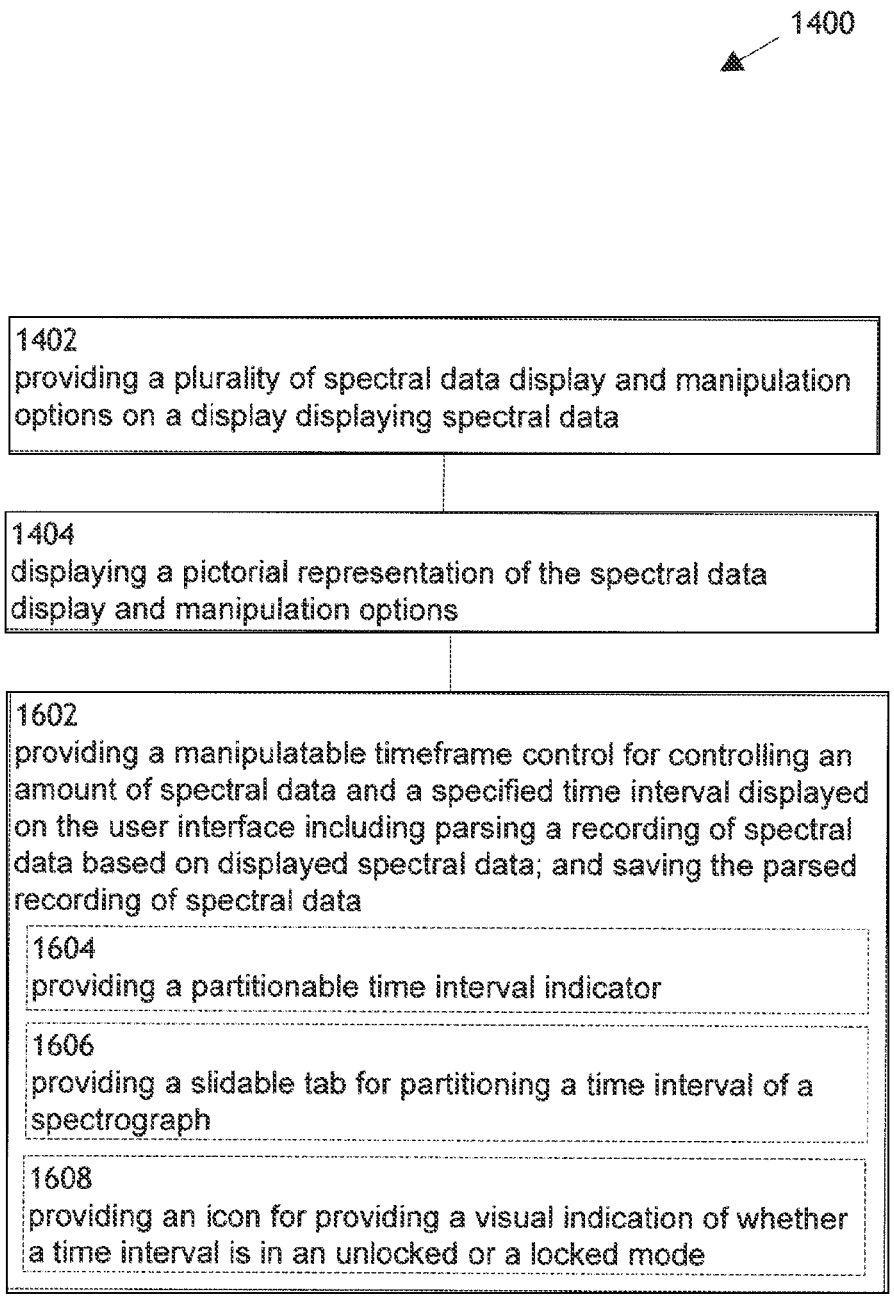

1402
providing a plurality of spectral data display and manipulation options on a display displaying spectral data

1404
displaying a pictorial representation of the spectral data display and manipulation options

1602
providing a manipulatable timeframe control for controlling an amount of spectral data and a specified time interval displayed on the user interface including parsing a recording of spectral data based on displayed spectral data; and saving the parsed recording of spectral data

1604
providing a partitionable time interval indicator

1606
providing a slidable tab for partitioning a time interval of a spectrograph

1608
providing an icon for providing a visual indication of whether a time interval is in an unlocked or a locked mode

FIG. 16

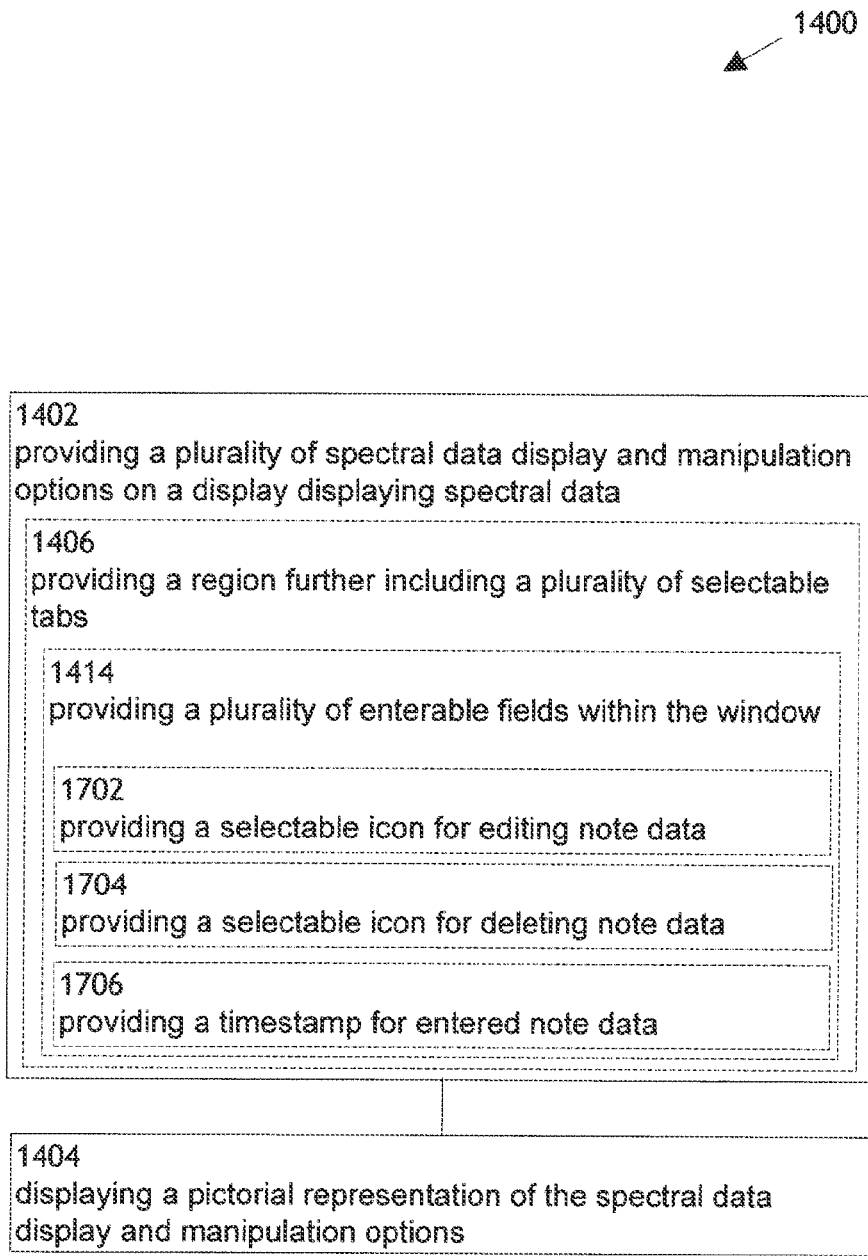

1400

1402
providing a plurality of spectral data display and manipulation options on a display displaying spectral data

1406
providing a region further including a plurality of selectable tabs

1414
providing a plurality of enterable fields within the window

1702
providing a selectable icon for editing note data

1704
providing a selectable icon for deleting note data

1706
providing a timestamp for entered note data

1404
displaying a pictorial representation of the spectral data display and manipulation options

FIG. 17

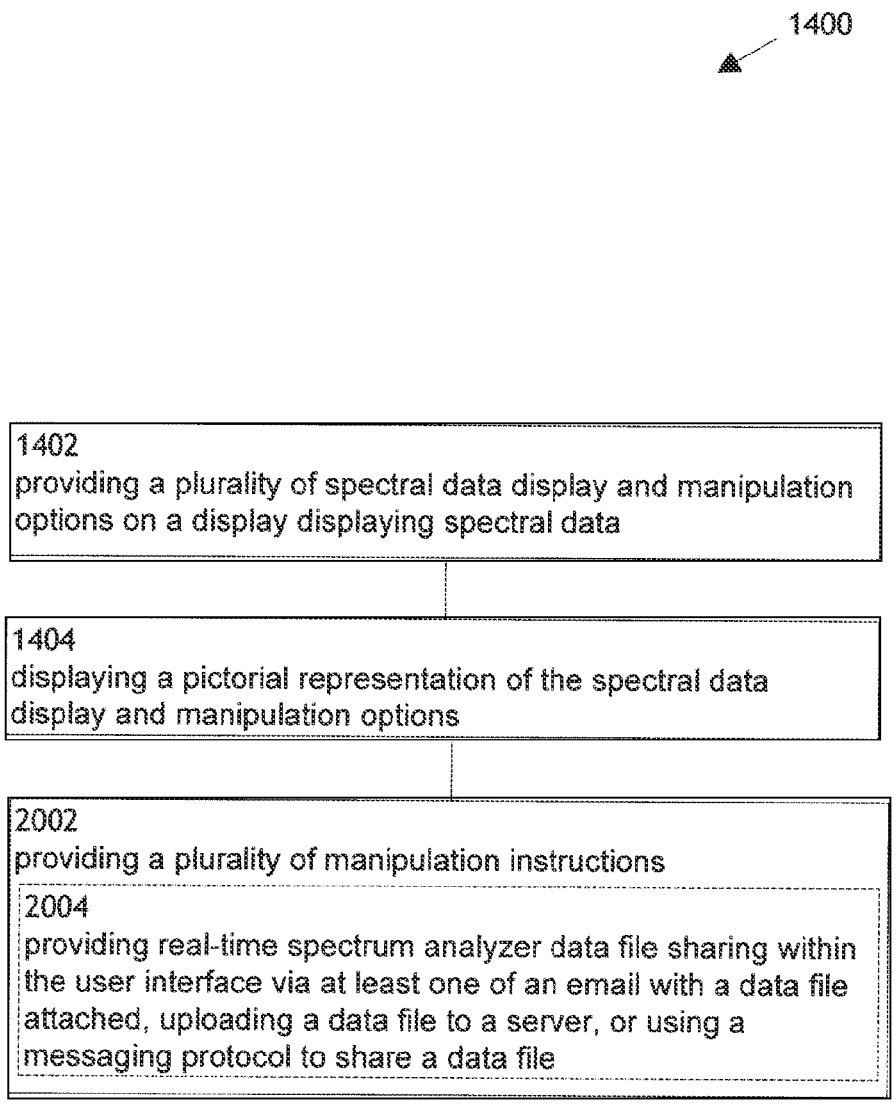

1402
providing a plurality of spectral data display and manipulation options on a display displaying spectral data

1404
displaying a pictorial representation of the spectral data display and manipulation options

2002
providing a plurality of manipulation instructions

2004
providing real-time spectrum analyzer data file sharing within the user interface via at least one of an email with a data file attached, uploading a data file to a server, or using a messaging protocol to share a data file

FIG. 20

SPECTRUM ANALYZER INTERFACE

RELATED APPLICATIONS

1. For purposes of the USPTO extra-statutory requirements, the present application constitutes a continuation-in-part of United States Patent Application entitled SYSTEM AND APPARATUS FOR DETECTING AND ANALYZING A FREQUENCY SPECTRUM, naming Ryan Woodings, as the inventor, U.S. application Ser. No. 11/605,839, filed Nov. 28, 2006. U.S. application Ser. No. 11/605,839 claims priority to and incorporates by reference U.S. Provisional Application Ser. No. 60/740,067, filed Nov. 28, 2005 and U.S. Provisional Application Ser. No. 60/809,324, filed May 30, 2006.
2. For purposes of the USPTO extra-statutory requirements, the present application constitutes a continuation-in-part of United States Patent Application entitled SPECTRUM ANALYZER USER INTERFACE, naming Ryan Woodings, Brian Tuttle and Don Valate Harrison as inventors, U.S. application Ser. No. 11/973,683, filed Oct. 9, 2007. U.S. application Ser. No. 11/973,683 claims priority to and incorporates by reference U.S. Provisional Application Ser. No. 60/850,052 filed Oct. 6, 2006 and U.S. Provisional Application Ser. No. 60/962,211 filed Jul. 27, 2007.
3. For purposes of the USPTO extra-statutory requirements, the present application constitutes a continuation-in-part of United States Patent Application entitled SPECTRUM ANALYZER USER INTERFACE, naming Ryan Woodings, Brian Tuttle and Don Valate Harrison as inventors, U.S. application Ser. No. 12/220,902, filed Jul. 28, 2008. U.S. application Ser. No. 12/220,902 claims priority to and incorporates by reference U.S. Provisional Application Ser. No. 60/850,052 filed Oct. 6, 2006, U.S. Provisional Application Ser. No. 60/962, 211 filed Jul. 27, 2007, U.S. Provisional Application Ser. No. 60/740,067, filed Nov. 28, 2005, U.S. application Ser. No. 11/973,683, filed Oct. 9, 2007, and U.S. application Ser. No. 11/605,839, filed Nov. 28, 2006.
4. For purposes of the USPTO extra-statutory requirements, the present application constitutes a continuation of United States Patent Application entitled SPECTRUM ANALYZER INTERFACE, naming Ryan Woodings, Brian Tuttle and Don Valate Harrison as inventors, U.S. application Ser. No. 13/214,359, filed Aug. 22, 2011.
5. For purposes of the USPTO extra-statutory requirements, the present application constitutes a continuation of United States Patent Application entitled SPECTRUM ANALYZER INTERFACE, naming Ryan Woodings, Brian Tuttle and Don Valate Harrison as inventors, U.S. application Ser. No. 13/437,168, filed Apr. 2, 2012.

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications; claims benefits under 35 USC §119(e) for provisional patent applications), and incorporates by reference in its entirety all subject matter of the following listed application(s) to the extent such subject matter is not inconsistent herewith:

FIELD

The present invention relates generally to the field of spectrum analyzers and more particularly to a spectrum analyzer interface.

BACKGROUND

Conventional spectrum analyzers lack certain spectrum display and data manipulation features, creating additional work for a user desiring a particular spectrum display or spectrum data manipulation. Consequently, it would be desirable to provide a system and method for enhanced graphical display and data manipulation for spectrum analysis.

SUMMARY

A computationally implemented method includes, but is not limited to: providing a plurality of spectral data display and manipulation options on a display displaying spectral data, the plurality of data display and manipulation options including: providing a region further including a plurality of selectable tabs, including: providing a tab displaying a signal profile database upon selection; providing a tab generating and displaying a window displaying spectral data at a specific time interval upon selection; and providing a tab displaying a window for entering a note upon selection, further including: providing a plurality of enterable fields within the window; and displaying a pictorial representation of the spectral data display and manipulation options, further including: displaying the region further including a plurality of selectable tabs, the selectable tabs including: displaying the signal profile database upon selection of the tab for displaying a signal profile database; displaying the window displaying spectral data at a specific time interval upon selection of the tab for generating and displaying the window displaying spectral data at a specific time interval; and displaying the window for entering a note upon selection of the tab for displaying a window for entering a note, further including: displaying the plurality of enterable fields within the window.

In one or more various aspects, related systems include but are not limited to circuitry and/or programming for effecting the herein-referenced method aspects; the circuitry and/or programming can be virtually any combination of hardware, software, and/or firmware configured to effect the herein—referenced method aspects depending upon the design choices of the system designer.

A computationally implemented system includes, but is not limited to: computer readable user interface instructions configured to provide a plurality of spectral data display and manipulation options on a display displaying spectral data, a user interface processor configured to display a pictorial representation of spectral data and manipulation options, and a user interface instruction engine configured to provide a plurality of manipulation instructions to the processor to provide manipulation of the displayed spectral data. The manipulation instructions may be received from a control device connected to a computing system and the manipulation of the displayed spectral data may be based on a user response to the displayed data manipulation options or a pre-determined selection of the displayed data display and manipulation options. For instance, user interface system may provide a default display option based on pre-selected options selected by the system or by a user prior to utilizing the user interface system to display and manipulate spectral data.

A computer program product stored on a computer readable medium usable with a programmable computer, the computer program product having computer-readable code embodied therein for displaying data in a graphical format, the computer-readable code comprising instructions for: providing a plurality of spectral data display and manipulation options on a display displaying spectral data via user interface software, the plurality of data display and manipulation options including: providing a region further including a plurality of selectable tabs, including: providing a tab displaying a signal profile database upon selection; providing a tab generating and displaying a window displaying spectral data at a specific time interval upon selection; and providing a tab displaying a window for entering a note upon selection, further including: providing a plurality of enterable fields within the window; and displaying a pictorial representation of the spectral data display and manipulation options via a user interface processor, further including: displaying the region further including a plurality of selectable tabs, the selectable tabs including: displaying the signal profile database upon selection of the tab for displaying a signal profile database; displaying the window displaying spectral data at a specific time interval upon selection of the tab for generating and displaying the window displaying spectral data at a specific time interval; and displaying the window for entering a note upon selection of the tab for displaying a window for entering a note, further including: displaying the plurality of enterable fields within the window.

A computationally implemented system includes, but is not limited to: user interface software configured to provide a plurality of spectral data display and manipulation options on a display displaying spectral data; a user interface processor configured to display a pictorial representation of spectral data and manipulation options including: a region further including a plurality of selectable tabs, the selectable tabs including: a tab displaying a signal profile database upon selection; a tab generating and displaying a window displaying spectral data at a specific time interval upon selection; a tab displaying a window for entering a note upon selection, further including: a plurality of enterable fields within the window; and a tab displaying Wi-Fi channel metrics upon selection; and a user interface instruction engine configured to provide a plurality of manipulation instructions to the user interface processor to provide display and manipulation of the displayed spectral data, including: instructions to display a pop-up window displaying the Wi-Fi channel metrics including displaying an amplitude of a section of frequency upon selection of the tab displaying Wi-Fi channel metrics.

A computer program product stored on a non-transitory computer readable medium usable with a programmable computer, the computer program product having computer-readable code embodied therein for displaying data in a graphical format, the computer-readable code includes, but is not limited to, instructions for mapping a range of detected densities of detected frequency signals to a corresponding range of color hues, generating a spectrum density graph displaying the detected frequency signals and corresponding densities as represented by the mapped corresponding range of color hues, and generating a waterfall spectrum graph displaying the corresponding detected densities utilizing the same color mapping of the detected range of densities of detected frequency signals as utilized by the generated spectrum density graph, thereby providing a density color match between data points on the spectrum density graph and the waterfall spectrum graph.

In addition to the foregoing, other system aspects are described in the claims, drawings, and text forming a part of the present disclosure. The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 10 is an illustration of a portion of a screen displayable by a user interface system utilized for analyzing detected frequency spectrum data;

FIG. 11 is an illustration of a portion of a screen displayable by a user interface system utilized for analyzing detected frequency spectrum data;

FIG. 12 is an illustration of a portion of a screen displayable by a user interface system utilized for analyzing detected frequency spectrum data; and FIGS. 13A and 13B are illustrations of a lockable time bar displayable by a user interface system utilized for analyzing detected frequency spectrum data;

FIGS. 14A and 14B are operational flows illustrating a method for analyzing frequency spectrum data displayable by a user interface system;

FIG. 16 is an operational flow illustrating a method for analyzing frequency spectrum data displayable by a user interface system;

FIG. 17 is an operational flow illustrating a method for analyzing frequency spectrum data displayable by a user interface system;

FIG. 20 is an operational flow illustrating a method for analyzing frequency spectrum data displayable by a user interface system;

DETAILED DESCRIPTION

Figure 1:
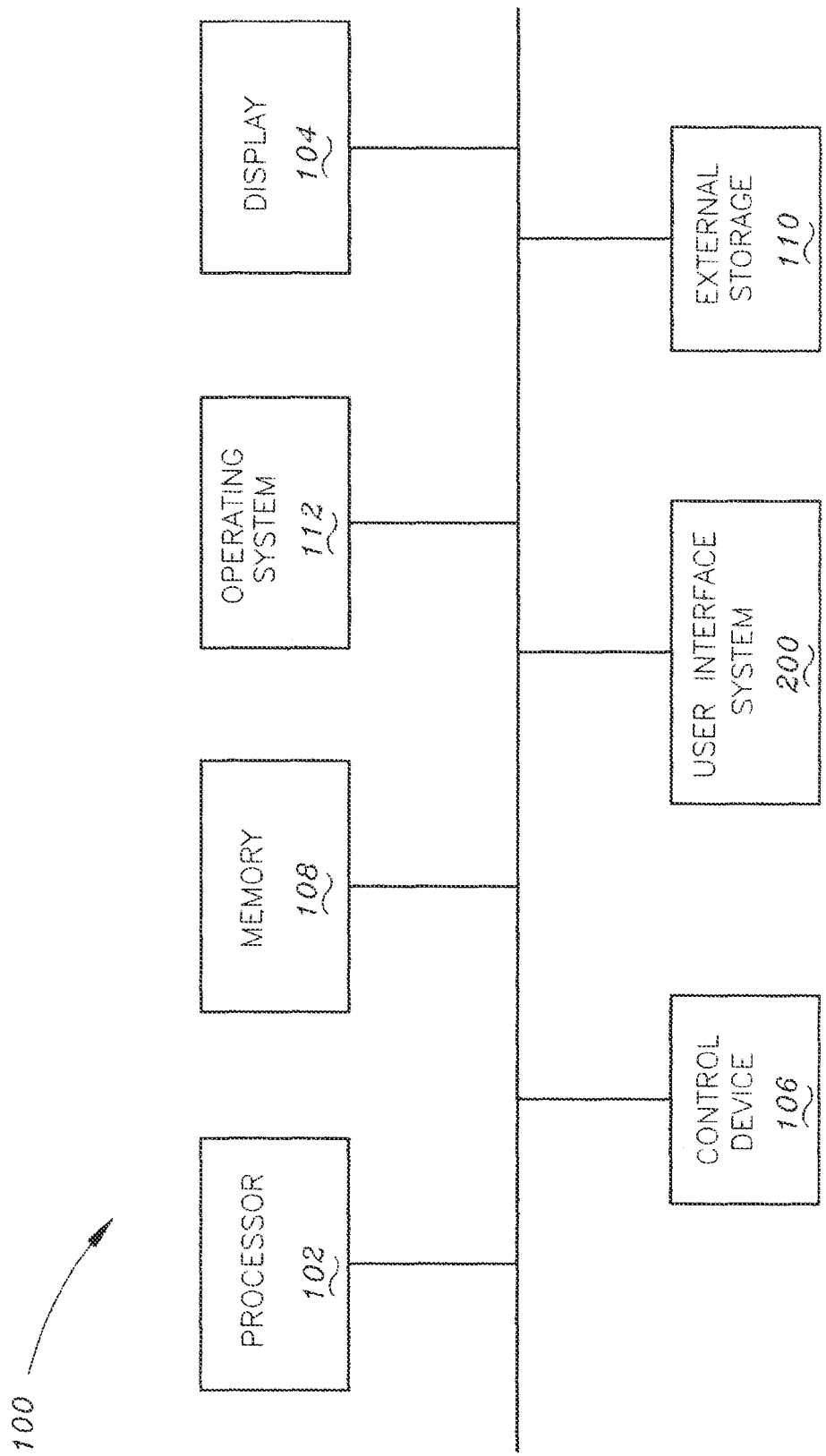
FIG. 1 illustrates a general purpose computer architecture 100 suitable for implementing embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

FIG. 1 illustrates general purpose computing system 100 suitable for implementing embodiments of the present invention. The general purpose computing system 100 comprises at least a processor 102, a display 104, a control device 106 and a user interface system 200 according to embodiments of the present invention. User interface system 200 may be controllable with the control device 106, such as a mouse, keyboard or touch sensitive screen or other such control device to manipulate text, images, and other objects on the display 104. These objects may include graphs, icons, windows, menus, and other images which may be displayed on the user interface. The general purpose computer 100 may also include memory 108, and may further comprise external storage 110. The general purpose computer 100 may include an operating system 112, such as Microsoft Windows, capable of executing programs, and applications. The components 102-112, 200 may be connected via a connection such as a bus 114. The system bus 114 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

As will be understood, embodiments of a user interface system 200 may be in the form of a software program, a software object, a software function, a software subroutine, a software method, a software instance, a code fragment, a hardware operation or user operation, singly or in combination. Embodiments of the user interface system 200 are thus executable on any general purpose computing architecture such as the general purpose computing system 100 of FIG. 1, but there is clearly no limitation that this architecture is the only one which can be used in implementing embodiments of the present invention. Embodiments of a user interface system 200 may further include software comprising a software interface for remotely or locally displaying and analyzing received spectral data on a computing device received from a spectrum analyzer. Software may further include at least one code segment displaying a plot of a received spectral data derived from a spectrum analyzer on a display screen of the computing device, a code segment displaying a plurality of commands and controls that may be selected to display the carrier signal in a desired manner on the display screen of the computing device; a code segment that displays a numeric keypad on the display screen of the computing device; a code segment that displays predetermined selection elements that are user selectable to present the carrier signal on the display screen of the computing device; a code segment that displays data relating to the frequency and amplitude of the carrier signal on the display screen of the computing device; a code segment that displays a print box on the display screen of the computing device that may be selected to print the plot of the carrier signal or the display screen; and a code segment that displays a selectable exit box on the display screen of the computing device for exiting the software.

In one embodiment, the user interface system 200 of the present invention is configured as a software program which, according to different embodiments, is capable of functioning with an existing GUI, by modifying an existing GUI's toolkit, or as a standalone configuration. The components of the general purpose computer 100 are interconnected through appropriate interfaces to a bus. It will be appreciated that the computing system 100 as illustrated is merely representative and the included components are likewise representative and not meant to be exhaustive.

Figure 2:
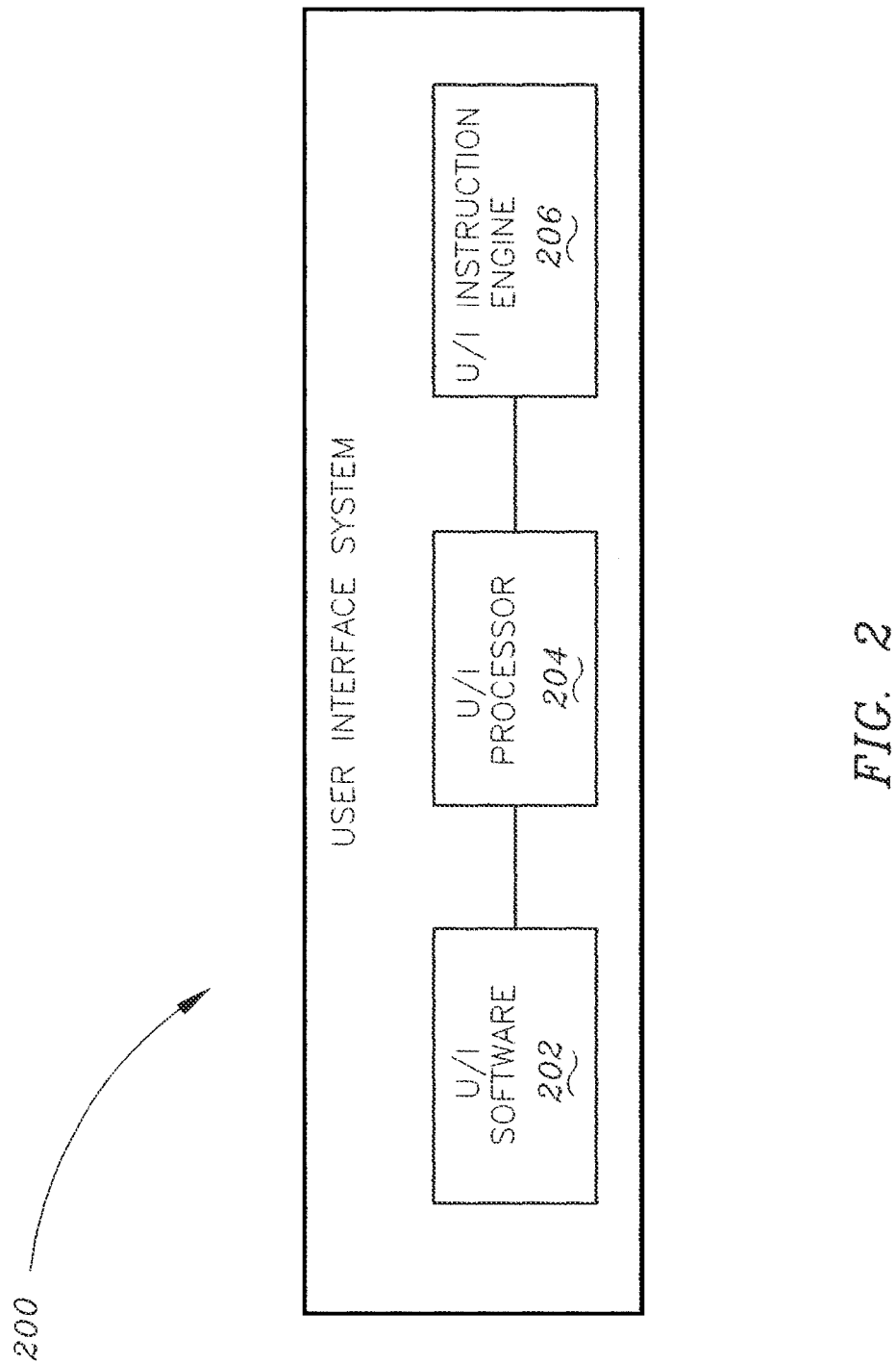
FIG. 2 a block diagram illustrating a system for enabling user interaction with spectrum analysis computer software running on a computer system configured to display spectrum analysis data on a display device.

Referring to FIG. 2, a block diagram illustrating a user interface system 200 for enabling user interaction with spectrum analysis computer software running on a computer system configured to display spectrum analysis data on a display device. User interface system 200 comprises user interface software 202 configured to provide a plurality of spectral data display and manipulation options on a display displaying spectral data, a user interface processor 204 configured to display a pictorial representation of spectral data and manipulation options, and a user interface instruction engine 206 configured to provide a plurality of manipulation instructions to the processor 204 to provide manipulation of the displayed spectral data. The manipulation instructions may be received from a control device connected to a computing system and the manipulation of the displayed spectral data may be based on a user response to the displayed data manipulation options or a pre-determined selection of the displayed data display and manipulation options. For instance, user interface system 200 may provide a default display option based on pre-selected options selected by the system or by a user prior to utilizing the user interface system to display and manipulate spectral data.

Figure 3A:
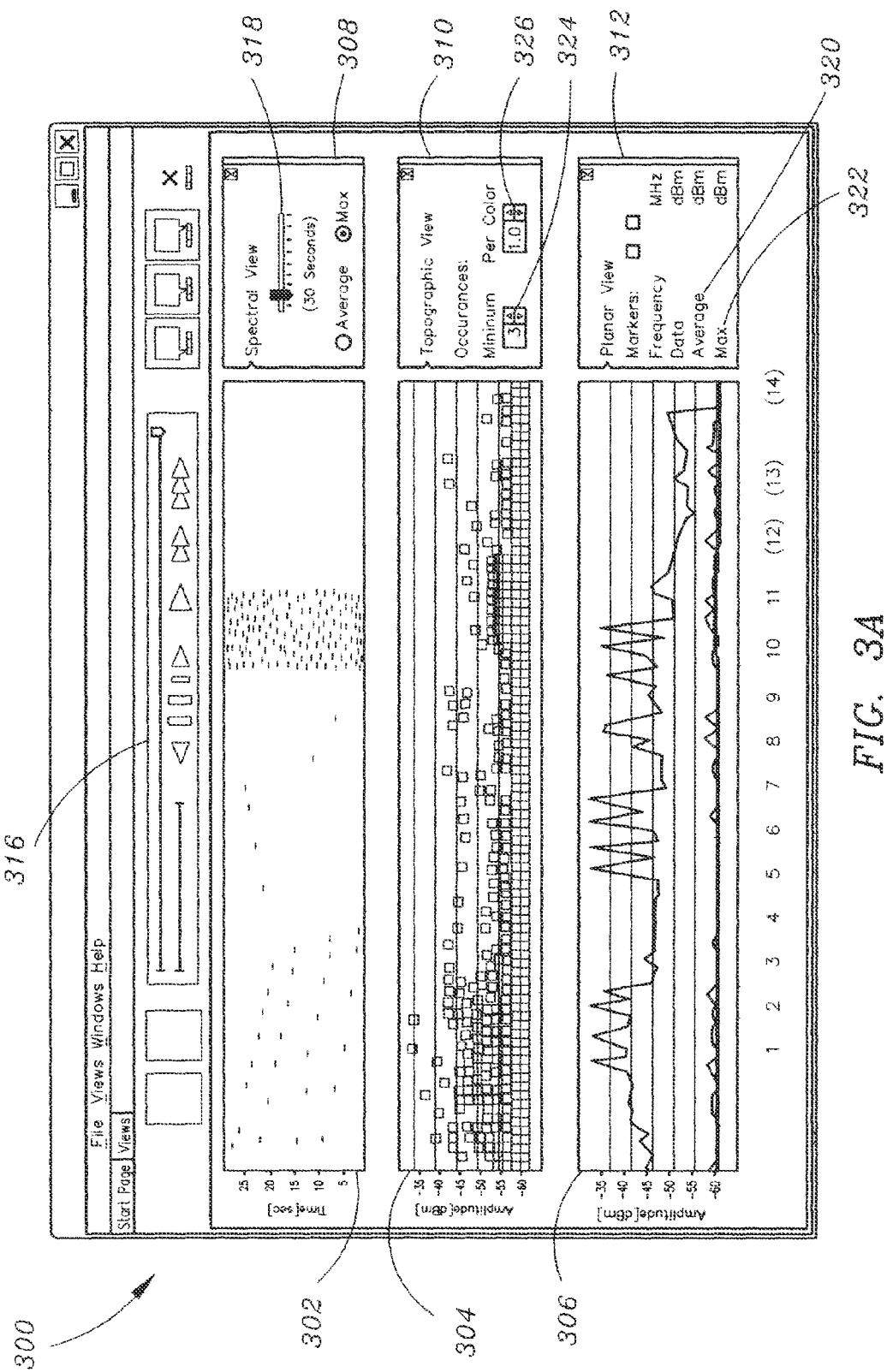
FIGS. 3A and 3B are illustrations of screens displayable by a user interface system utilized for analyzing detected frequency spectrum data.
Figure 3B:
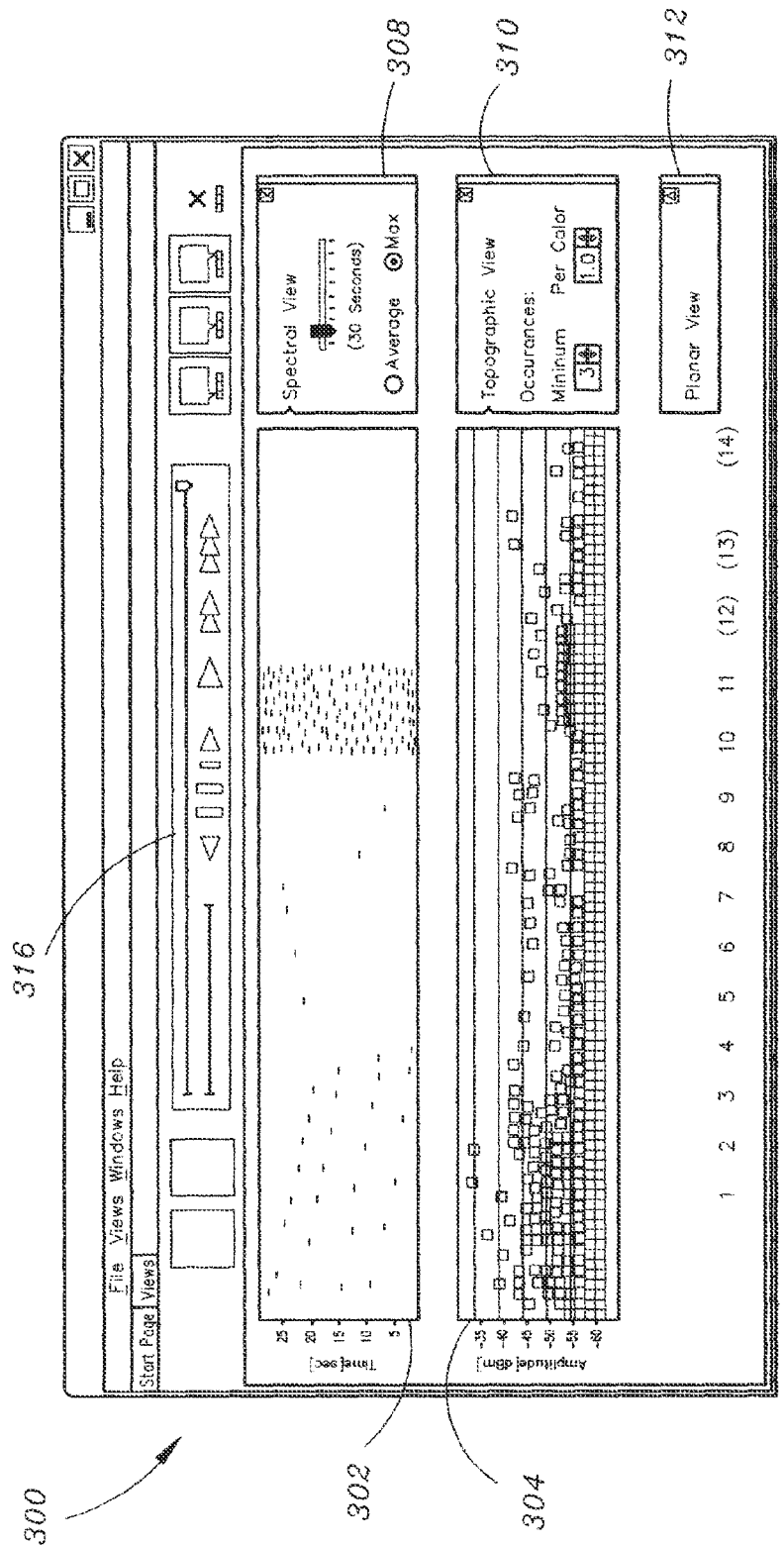

Referring to FIG. 3, an illustration of a screen 300 displayable by a user interface system 200 utilized for analyzing detected spectrum data in accordance with an exemplary embodiment of the present invention is shown. User interface system 200 may provide collapsible controls or groups of controls. Collapsible groups of controls may expand and contract to display or hide the controls in the group. In applications where a group of controls corresponds to other data in the application that may be displayed or hidden, the state of the collapsible panel of controls may be used to control whether the other data is displayed or not. For example, referring to FIG. 3A, three graphs 302, 304, 306 are displayed on the left and a group of controls 308, 310, 312 are displayed to the right of each graph. In the embodiment shown, control groups may be a spectral view control group 308, a topographical view control group 310 and a planar view control group 312, corresponding respectively to a spectral view graph 302, a topographic view graph 304 and a planar view graph 306. Planar view graph 306 may also be referred to as a two dimensional or linear spectral graph. Referring to FIG. 3B, user interface system 200 may provide a display option where the title and/or icon of one group, such as planar view of group 312, is displayed if the group of controls is in a collapsed mode. If a group of controls is collapsed, a corresponding graph does not display. The group of controls may be expanded, such as via an expansion icon 314, allowing the corresponding graph, such as 306, to be displayed. State of collapsible group of controls information may be utilized to determine the state of other displayed information related to that group of controls. Specifically using the state of groups of controls may be utilized to determine the state of displayed graphs for spectrum analyzers.

User interface system 200 may provide a playback options interface 316 configured to provide playback options such as pause, rewind, advance, live playback of a data stream and the like. User interface system 200 playback options interface 316 may be configured to display instantaneous data, and allow a user to pause the display, rewind the data to review previous data segment, and to advance forward or skip to a later data segment, up to the instantaneous data, after reviewing the information. Playback options interface 316 allows the user to review past data without requiring the user to explicitly record the data to a file.

User interface system 200 may provide a spectral view 302 of data to be analyzed. Spectral view control group 308 may provide a time scale adjustment control 318 suitable for adjusting the time scale that is displayed. For example, the spectrograph may display a few seconds of data or a few hours of data. As the user adjusts the time scale, the user interface system 200 may update the spectrograph in real-time to show the information for the desired amount of time.

User interface system 200 may also control a time position by providing a scrolling spectral view. View of spectral analysis data may be provided as a waterfall type spectrograph. In a waterfall type spectrograph, time may be graphed on one axis (spectral view). User interface system 200 may provide control of the current time position by providing scrolling of the spectral view. User interface system 200 may comprise a scroll bar, a keyboard shortcut, or a mouse scroll wheel to allow for spectral view scrolling. Scrolling the spectral view may then control the current time position of the data being displayed, allowing a user to traverse forward or backward through the data.

Figure 5:
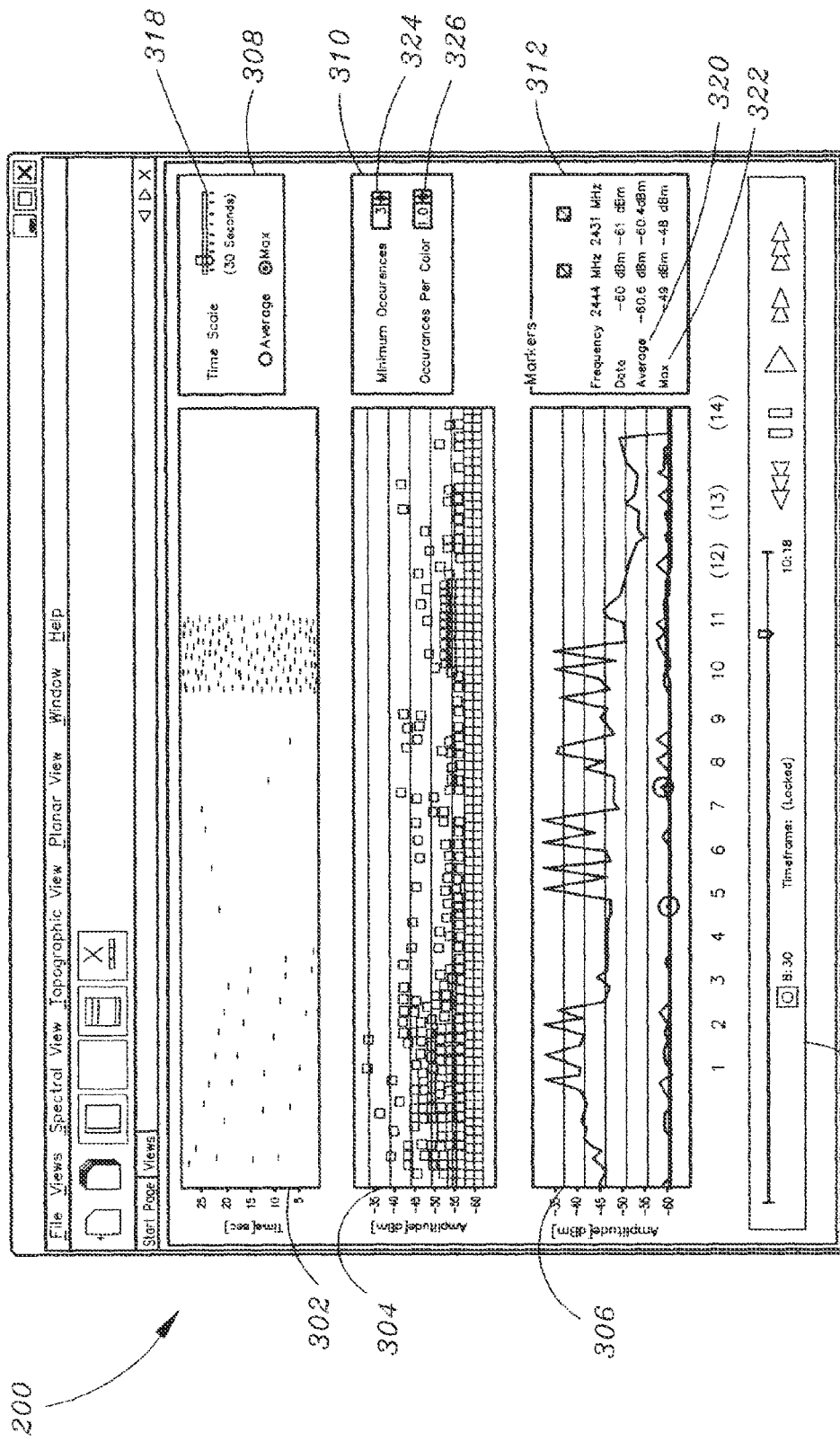
FIG. 5 is an additional illustration of an analysis of detected frequency spectrum data displayable by a user interface system.

As shown in FIGS. 3A, 3B and FIG. 5, user interface system 200 may provide a set of user selectable features to allow a user to select from the plurality of features to display, such as the average amplitude 320 or the maximum amplitude 322.

User interface system 200 may further provide a topographic view 304 for a user. User interface system 200 may provide a display of a frequency versus amplitude plane divided into a grid containing a plurality of frequency-amplitude pairs. User interface system 200 may track how often an RF signal matches each frequency/amplitude pair. User interface system may provide a color gradient configured to identify high occurrences of a frequency/amplitude pair versus low occurrences of a frequency-amplitude pair. For example, a first color, such as black, may represent frequency-amplitude pairs that never occur, a second color, such as blue, may represent frequency-amplitude pairs that rarely occur, and a third color, such as red, may represent frequency-amplitude pairs that occur regularly.

The user interface system 200 topographic view control group 310 may provide adjustment capabilities, such as adjustment of the minimum number of occurrences of a frequency-amplitude 324 pair before the frequency-amplitude pair is marked. The user may also adjust the maximum number of occurrences the user desires to analyze, and each frequency-amplitude pair occurring at least the desired number of instances may be similarly distinguished, such as colored with a single color 326. The color gradient may then be scaled between the minimum and maximum number of occurrences that the user is interested in. User interface system 200 may also provide scaling of the color gradient based on the number of occurrences each specific color in the gradient represents. User interface system 200 may also display amplitude color based on the number of occurrences of a frequency, utilized "weather map" colors to indicate "hold" spectral regions, i.e., regions of high spectral activity, and "cold" spectral regions, i.e., regions of low spectral activity. User interface system 200 may also allow a user to control minimum number of occurrences of a frequency to display and adjust the one or more display colors (such as occurrences per color).

User interface system 200 may provide a topographic view 304 utilizing a plurality of colors 326 to symbolize the respective popularities or density (i.e., the duty cycle or number of occurrences of a frequency) of each of a plurality of frequency-amplitude points. It is contemplated that, subject to the input data, the maximum popularity of a point may range from 0% to 100%. Additionally, the input data for a given location may vary such that the popularity of points is constantly changing. By analyzing the data for all frequency-amplitude points in view, the color scheme may be automatically scaled and/or adjusted to show the largest color range possible for the given input data. In other words, the color scheme may be scaled to match the input data.

Spectral analysis data may be viewed based on a plurality of distinct timeframes, ranging, in one embodiment from approximately a few seconds to multiple hours. Each view may display data for a different time interval, or timeframes of all views may be unified such that an individual view of a timeframe is a different view of the same data shown in any other of the plurality of views.

User interface system 200 may provide a plurality of recording options for captured and displayed spectral data. A recorded timeframe may be entirely displayed when cropping the timeframe for analysis. By displaying the data from the entire recording, a user may quickly determine the desired timeframe for the clipping or cropping. For example, user interface system 200 may allow user adjustment of one or more recording times, such as the beginning and end times of a clipping, and the user interface system 200 may adjust to display the data contained with the currently selected timeframe.

User interface system 200 may provide relative advance or rewind speeds based on a displayed timeframe. Typical video playback displays a fraction of data at a given time interval. However, user interface system 200 may provide spectral analysis data display for any particular amount of time. For example, user interface system 200 may display a range of data ranging from approximately 15 seconds to 1 hour of data simultaneously. User interface system 200 may provide adjustment of the advance and rewind speeds in relation to the timeframe in view to allow the spectral analysis data to be scanned relatively quickly in either forward or reverse. For example, if 1 minute of data is displayed the fast forward speed may be 2×, but if 15 minutes of data is displayed the fast forward speed may be 30×, allowing the data in view to completely refresh at a relatively equal rate regardless of timeframe length.

Figure 4:
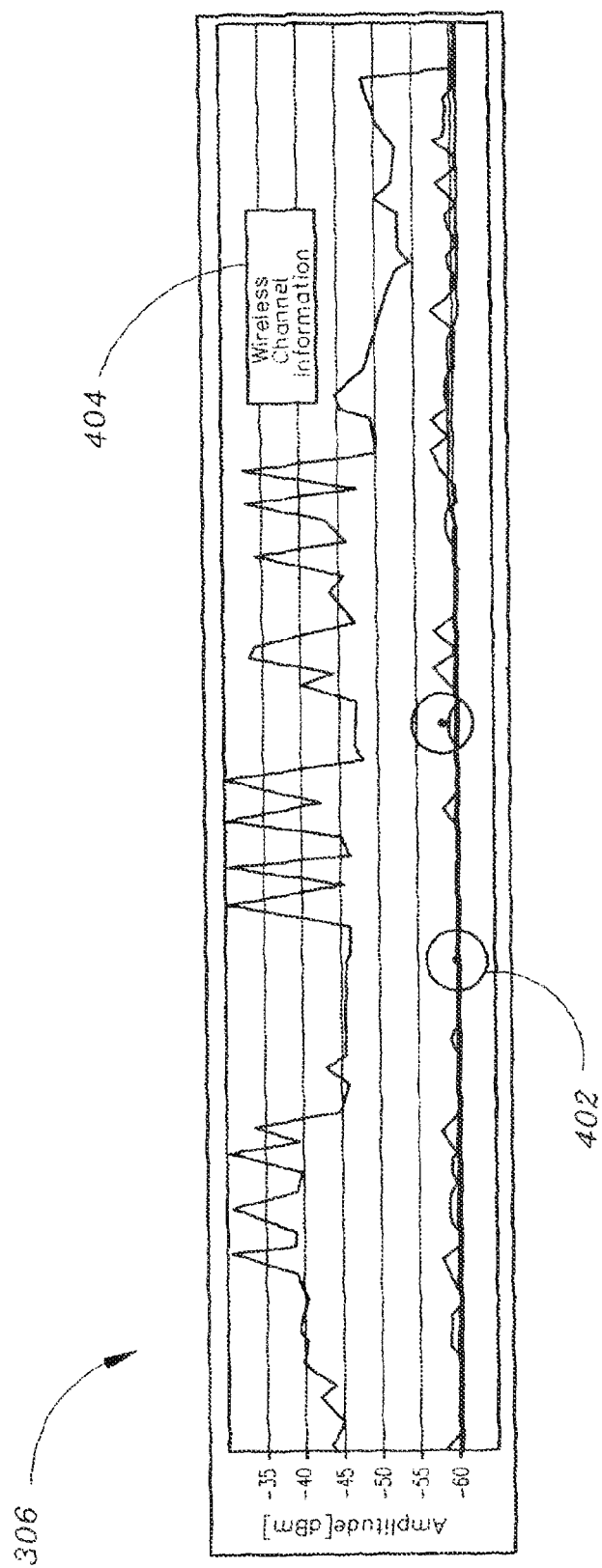
FIG. 4 is an illustration of an analysis of detected frequency spectrum data displayable by a user interface system.

Referring to FIG. 4, an illustration 306 of an analysis of detected frequency spectrum data displayed on a graphical user interface of a user interface system 200 in accordance with an exemplary embodiment of the present invention is shown. User interface system 200 may provide a marker 402 on the display that may be moved across an axis, such as a frequency axis (typically x-axis). Pertinent information related to that frequency may then be displayed, such as current, average, and maximum amplitudes. The marker 402 may be centered vertically at the current amplitude of that frequency and thus traverse up and down the y-axis based on the amplitude of that frequency. User interface system 200 may provide marker location to facilitate locating a marker on the display or to following the marker as it is moved left and right across frequencies. In one embodiment, user interface system 200 may be configured to gray out or dim all or substantially all of the background surrounding the marker, allowing the marker 402 to appear brighter. User interface system 200 may also be capable of brightening the marker 402 to provide enhanced visibility for the marker 402.

With continued reference to FIG. 4, user interface system 200 may be configured to display an information overlay 404 over the displayed spectral data. For example, when a wireless or Wi-Fi network is displayed, user interface system 200 may display wireless or Wi-Fi channel and network information overlaid on the displayed network. Information may be grouped together into desired groups, and each group of data may be displayed when relevant or desired to be displayed and hidden irrelevant, less useful than other groups of information, or desired to be hidden. The information groups may be overlaid on raw spectrum analyzer data, allowing the user to view the data in layers, where each layer may be turned on or off allowing simultaneous viewing of any number of layers based on the user's current task. Determining which layers are displayed at any given time may either be manually controlled by the user or automatically selected by the user interface system 200 system based on the current task or user preferences.

Referring to FIG. 5, a graphical user interface system 200 for a spectrum analyzer illustrating a spectrographic view, topographic view (as described above), and a planar view graph simultaneously is shown. User interface system 200 may display spectral view, topographic view, and planar view and any other view simultaneously (or any 1-2 of these views simultaneously) in vertical arrangement so frequencies line up vertically. For instance, in one embodiment, the plurality of graphs may be arranged to provide a frequency axis configured to line up and lining up with respect to the plurality of displayed graphs. A user may gather data from all graph types or a subset of displayed graph types simultaneously and to easily correlate data between graphs due to the aligned frequencies.

User interface system 200 may provide auto-adjustment of an amplitude range in the spectrum analyzer to provide a user with all data in view while minimizing screen space occupation screen space.

Spectral analysis data is typically a measurement of the signal strength (amplitude) of a specific frequency. However a user may not require amplitude data of any single frequency. Rather the user may require or desire to analyze the amplitude of a section of frequency, such as a wireless or Wi-Fi channel. By aggregating the data for the entire frequency range contained in a wireless or Wi-Fi channel the user interface system 200 may provide such information as the average and maximum amplitude for the entire channel. Also the user interface system 200 may automatically select between showing raw frequency information and showing channel information based on user settings and/or current display settings. For example, if the x-axis is displaying frequency information, frequency-specific metrics may also be displayed. If the x-axis is displaying channel information, channel-specific metrics may also be displayed.

User interface system 200 may also be configured to provide and include instructions for displaying an aggregated display from multiple spectrum analyzers. Aggregated display may be provided to a user monitoring multiple remote spectrum analyzers. Data may be aggregated from multiple analyzers into a single interface to allow the user to compare the data from various analyzers, as well as simultaneously monitor multiple analyzers without continuously switching windows (tabs, etc). Aggregated data may be used to monitor a wider frequency band than may be analyzed by a single spectrum analyzer at, for instance, a given frequency step size, resolution bandwidth, and sweep time). The aggregated data may also be utilized to monitor a larger physical area than a single spectrum analyzer may monitor. Multiple spectrum analyzers connected to a single monitoring application may be utilized to triangulate a signal source to determine its exact location. By aggregating data from multiple spectrum analyzers and triangulating signal sources it is then possible to create three dimensional maps of signal sources and signal strengths.

Figure 6:
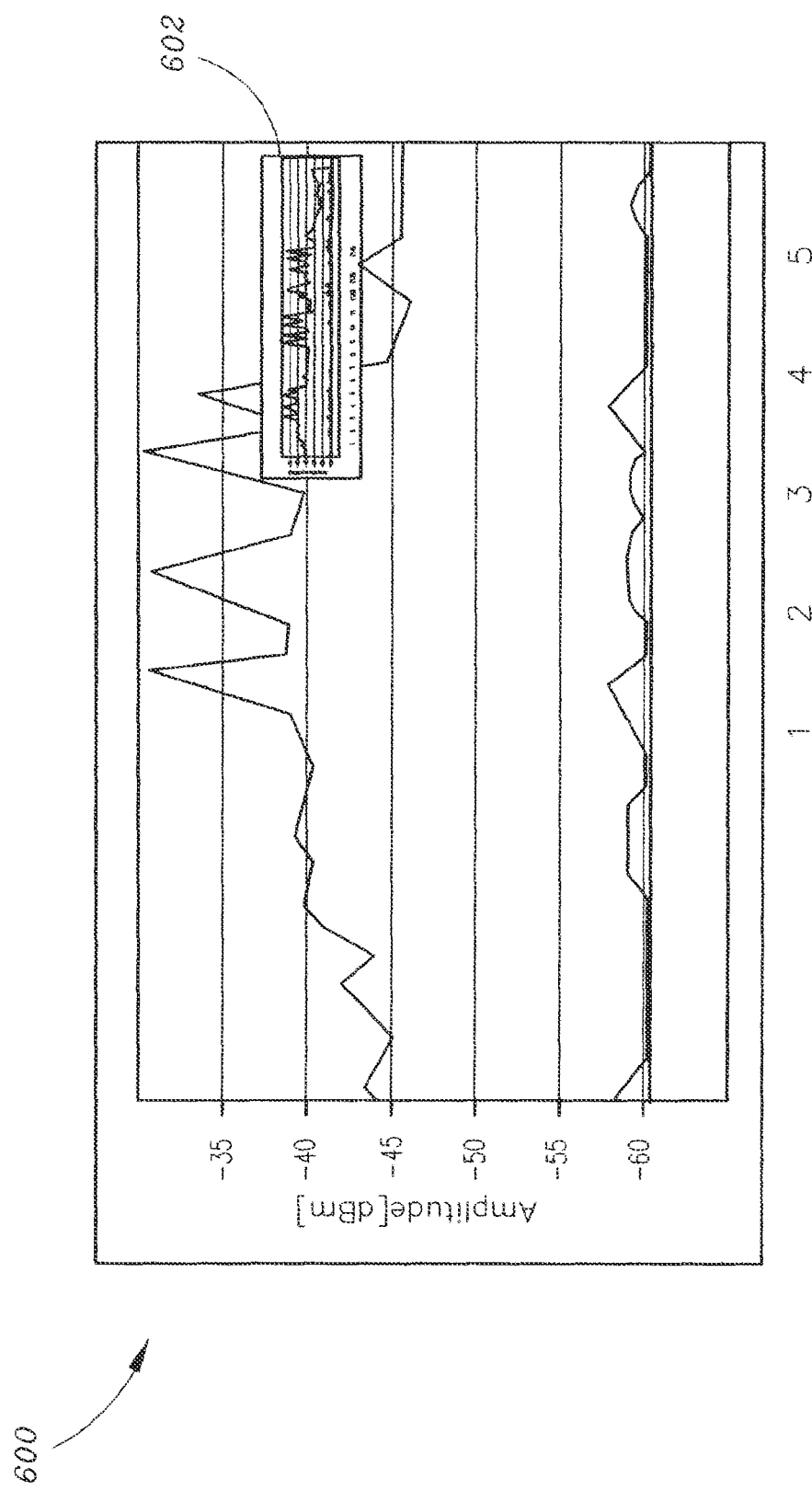
FIG. 6 is an illustration of a time bar suitable for display on a user interface.

Referring to FIG. 6, a further additional view 600 of a display provided by a user interface system 200 according to exemplary embodiments of the present invention is shown. User interface system 200 may provide a magnification function configured to and including instructions to magnify a selected area of the spectrum analyzer display. When analyzing spectrum analyzer data, it may be useful to examine a small area of data in greater detail. Magnification view may display an enlarged view of a subset of data as well as display additional information regarding the subset of data, such as average, current, and maximum amplitudes of the frequency/channel being magnified. User interface system 200 may provide a user with an overview when the user interface is zoomed in displaying a detailed view. For instance, when a user zooms in to a narrow band, such as between channels 1-5, as shown in FIG. 6, the user interface system 200 may capture a wider band of data on a periodic basis to provide an overview. For example, 1 in every 10 frequency sweeps may sweep the wider band so that the narrow band is very detailed, but enough information is gathered to display a basic overview. The wide-band overview may be displayed in a small window 602 within the window displaying the detailed view. The smaller within display window 602 may also be configured to and including instructions to display a different narrow frequency band, or other such data as desired by a user. For example, the user interface system 200 may display a detailed view of 802.11b channel 2 and the smaller within display window may display activity occurring on 802.11b channel 11.

Figure 7:
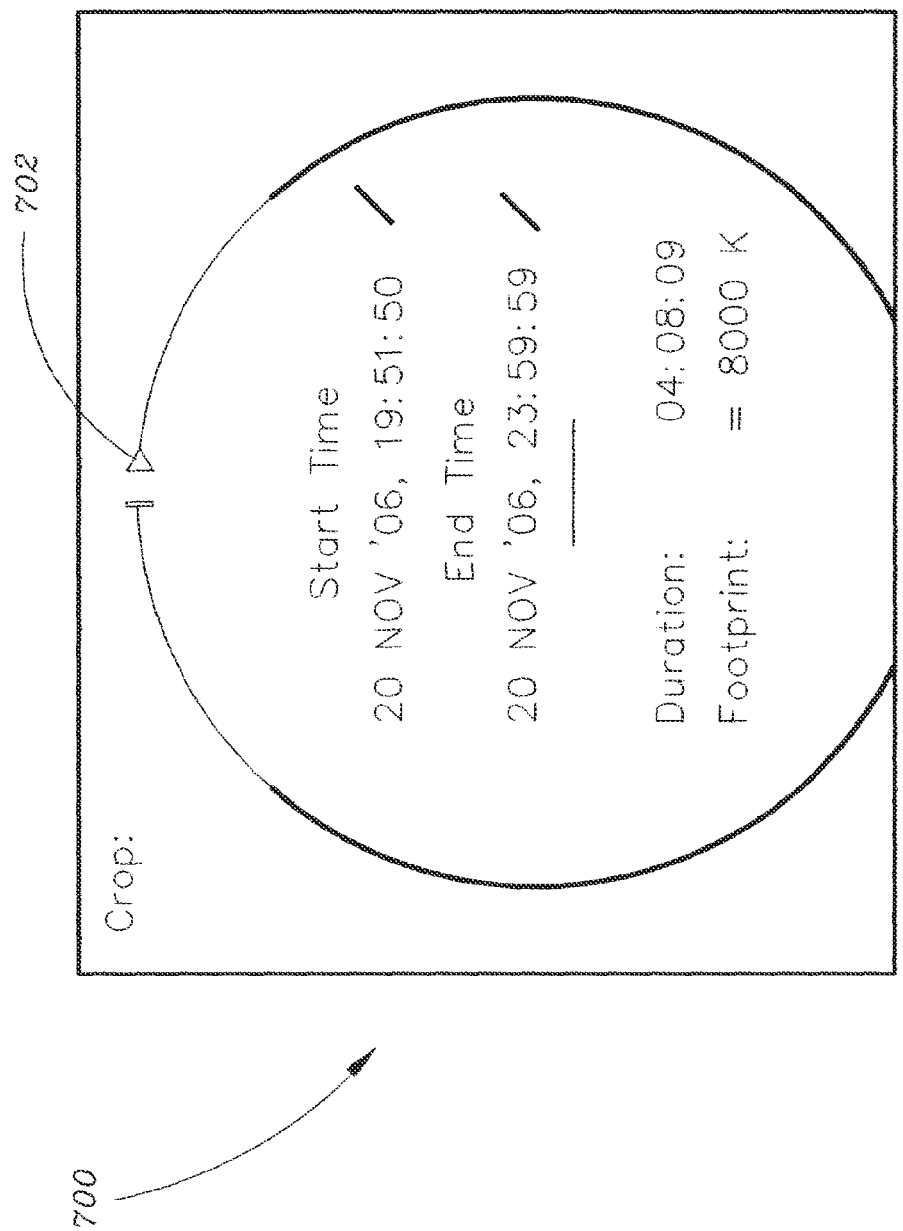
FIG. 7 is an illustration of a circular time bar generated by the user interface system.

Referring to FIG. 7, an illustration of a circular time bar 700 generated by the user interface system 200 according to exemplary embodiments of the present invention is shown. User interface system 200 may provide a circular time bar 700 for cropping a data file. Circular time bar 700 may comprise one or more controls 702 configured to and including instructions to select the beginning and end times of the desired cropping, providing fine precision cropping without requiring the full horizontal space of a straight, horizontally configured or vertically configured time bar.

Figure 8:
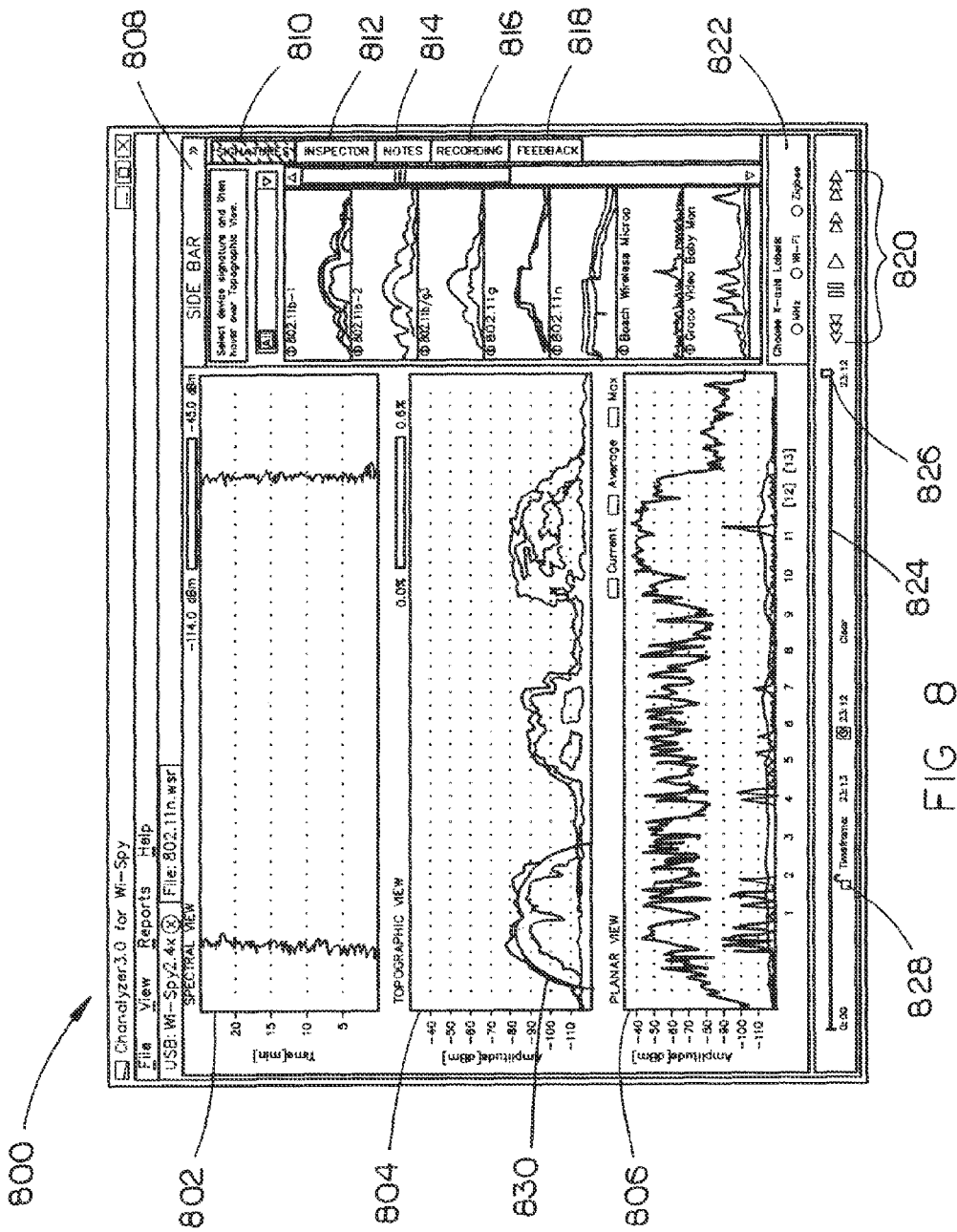
FIG. 8 is an illustration of a screen displayable by a user interface system utilized for analyzing detected frequency spectrum data.
Figure 9:
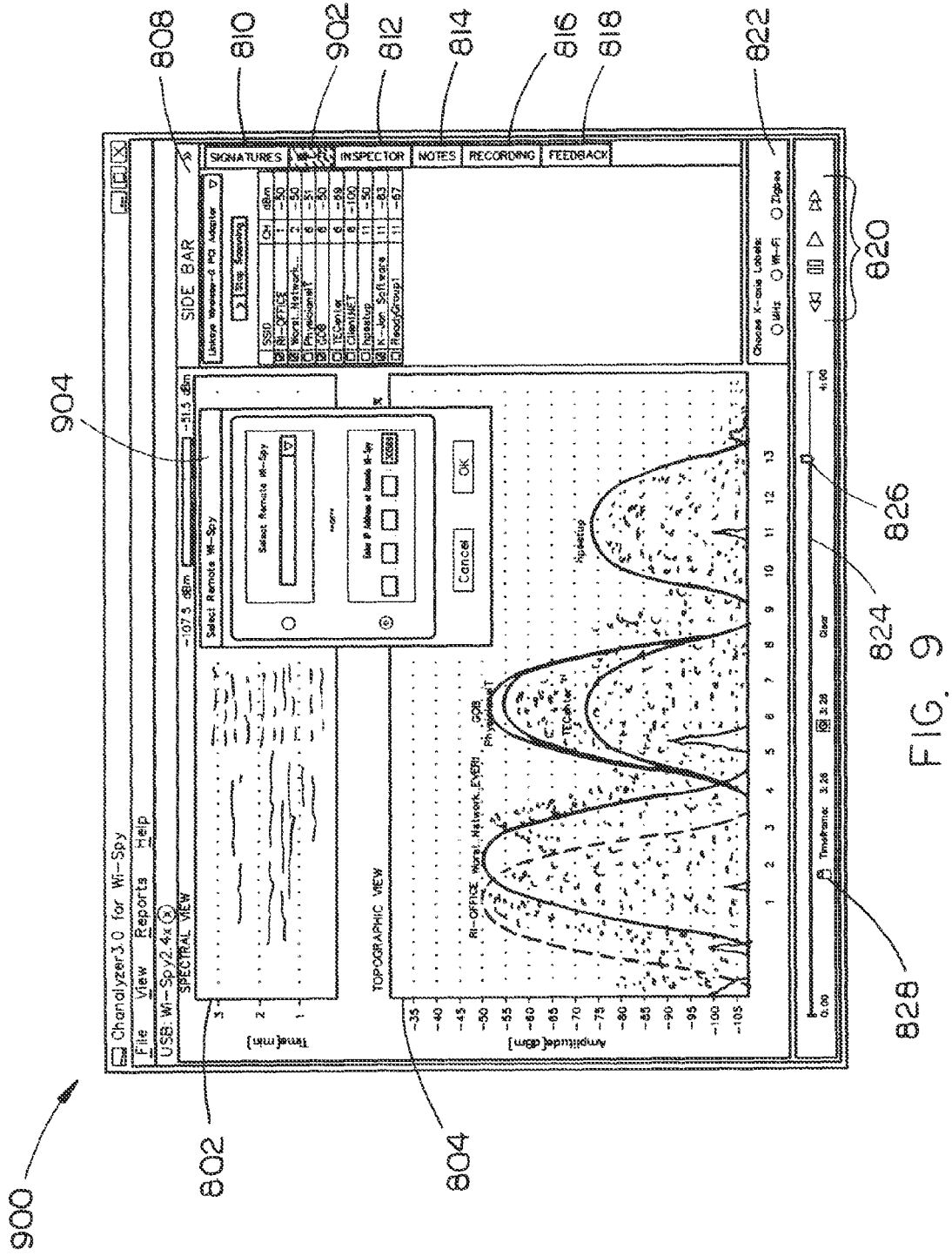
FIG. 9 is an illustration of a screen displayable by a user interface system utilized for analyzing detected frequency spectrum data.

Referring to FIG. 8, an illustration of a screen 800 displayable by a user interface system 200 configured to and including instructions to receive and execute display and analysis instructions utilized for analyzing detected frequency spectrum data is shown. Referring to FIG. 9, an additional illustration of a screen 900 displayable by a user interface system 200 configured to and including instructions to receive and execute display and analysis instructions utilized for analyzing detected frequency spectrum data is shown. Referring to FIG. 10, an illustration of a portion of a screen 1000 displayable by a user interface system 200 configured to and including instructions to receive and execute display and analysis instructions utilized for analyzing detected frequency spectrum data is shown. Referring to FIG. 11, an illustration of a portion of a screen 1100 displayable by a user interface system 200 configured to and including instructions to receive and execute display and analysis instructions utilized for analyzing detected frequency spectrum data is shown. Referring to FIG. 12, an illustration of a portion of a screen 1200 displayable by a user interface system 200 configured to and including instructions to receive and execute display and analysis instructions utilized for analyzing detected frequency spectrum data is shown. Referring to FIGS. 13A and 13B, illustrations 1300 of a lockable time bar displayable by a user interface system utilized for analyzing detected frequency spectrum data are shown.

Referring to FIG. 2, and as described previously, user interface instruction engine 206 may include instructions for displaying a plurality of analysis and enhancement tools, tabs, windows, icons or other visual indications useful for manipulating and enhancing captured spectral data. As illustrated in FIGS. 8-12, user interface system 200 may be configured to and include instructions to display at least one of a spectral view 802, a topographic view 804 and/or a planar view 806. User interface system 200 may also be configured instructions to display at least a portion of data in a region 808 further including a plurality of selectable data viewing and analysis enhancement options 8010-818 (hereinafter also referred to as selectable tabs). Selectable tabs may be of any shape, size, color, and may be displayed in any region of the user interface. Selectable tabs may be displayed in one region (e.g., a selectable tab on the right hand side of the displayed user interface as shown in FIG. 8), or may be each be displayed in a separate region of the user interface. Selectable tab display may be modified by a user as desired. Selectable tabs may be selectable icons (e.g. responsive to a mouse click or hover), may be accessible via a drop down menu displayed on the user interface, and/or may be accessible via a pop-up or inset window displayed on the user interface. Selectable tabs 8010-818 may display upon selection of the selectable tab by a user. Selectable tabs may provide a plurality of selectable data viewing and analysis enhancement options. User interface system 200 may also include instructions to display manipulatable and/or selectable regions and/or icons including icons for providing playback control 820, a region for selecting a preferred X-axis view 822, a manipulatable timeframe control including time interval indicator 824, a time interval tab 826, and a lock icon 828 for locking a time interval on the time interval indicator 824. In one embodiment, user interface system may include instructions displaying options for a user may to select a start time, an end time, and an amount of spectral data to be included in a parsed recording or recorded segment and to save a parsed segment separately.

A selectable data viewing and analysis enhancement option may be a tab configured to display and displaying the signal profile database upon selection 810. User interface system 200 may include an engine configured to and including instructions to perform spectral analysis pattern recognition based on one or more images. User interface system 200 may recognize a pattern in a spectrum and determine the type of device transmitting a given signal. Spectral analysis pattern recognition may be provided for raw data or for at least one image produced after raw data has been processed (e.g., an image displayed to a user on the interface). User interface system 200 may utilize standard image recognition techniques to recognize a pattern in the data or create specialized techniques specific to spectrum analyzer data. User interface system 200 may utilize any image recognition technique suitable for spectral analysis pattern recognition. A signal profile database tab may be compiled. Upon selection of the signal profile tab 810, a plurality of signal profiles may be displayed. FIG. 10 shows a detailed view 1000 of displayed signal profiles included in a signal profile database tab 810. User interface system 200 may include a searchable database for collection and storage of a plurality of signal patterns or profiles (e.g., microwave, cordless phone, baby monitor, a 2.4 GHz telephone signal) in a signal profile database. As shown, signal profiles may include an 802.11b-1 signal profile, an 802.11b-2 signal profile, an 802.11b/g3 signal profile, an 802.11g signal profile, an 802.11n signal profile, a wireless microphone, a baby monitor and so on. Displayed signal profiles may be compared with captured spectral data for determining a source or device type of an interference signal.

A selectable data viewing and analysis enhancement option may be a selectable tab configured to and including instructions to generate and display a window displaying spectral data at a specific time interval upon selection 812. User interface system 200 may detect a selected point (e.g., selected by a mouse hovering over a point, a click on a point, etc.) on a displayed spectrograph and display spectral data information (e.g., frequency, amplitude, popularity) for the selected point in the window. FIG. 11 shows a detailed view 1100 of spectral data information for a selected time interval displayed in a window of the user interface.

As described previously, user interface system 200 may include a manipulatable timeframe control for controlling an amount of spectral data displayed on the user interface. Timeframe control may control displayed spectral data in each view (e.g., spectral, topographic, planar). Specifically, user interface system 200 may include a partitionable time interval indicator 824 and a tab 826 for partitioning a time interval of a spectrograph. In one instance, partitionable time interval indicator 824 may be programmed in an initial set-up to display as a linear bar displaying an amount of total spectral data collection time and a sub time interval overlaid over the total spectral data collection time representation representing an entire time period in which spectral data has been collected. For instance, time interval indicator 824 may display a time interval from 0 to 8 minutes, and, if 2 minutes of spectral data have been collected, time interval indicator 824 may overlay the sub time interval indication over the 0 to 2 minute segment of the 0 to 8 minute time interval.

User interface system 200 may be further configured to and include instructions to partition a time interval based upon a detected selection of a time interval. User interface system 200 may detect a selected time interval that is less than the total spectral data collection time and display spectral data only for the selected time interval. Tab 826 may be slidable along the time interval indicator 824 to a desired position. User interface system 200 may further prevent the display from displaying spectral data outside of the selected time interval. FIGS. 13A and 13B illustrate a lockable time bar 824 displayable by a user interface system 200 utilized for analyzing detected frequency spectrum data. For instance, user interface system 200 may include displaying a "lock" icon 828 or other such graphic in either an unlocked or locked configuration to indicate an unlocked or locked time interval. User interface system 200 may detect selection (e.g., a mouse click) of the lock icon 828 and display spectral data collected up to the time interval at which the lock selection was detected. Selected time interval may be adjustable (e.g., via dragging the time interval tab 826), and user interface system 200 may detect an adjustment to the time interval and display spectral data associated with the adjusted time interval upon detecting a time interval adjustment.

Referring to FIG. 9, user interface system 200 may be configured to and include instructions to display Wi-Fi channel metrics. User interface system 200 may include a selectable tab 902 for displaying Wi-Fi channel metrics. User interface system 200 may further include instructions to display a pop-up window 904 or other such display displaying Wi-Fi channel metrics including displaying the amplitude of a section of frequency, such as a wireless or Wi-Fi channel upon selection of the Wi-Fi tab 902. By aggregating the data for the entire frequency range contained in a wireless or Wi-Fi channel, user interface system 200 may allow a user to view information including, but not limited to, an average and/or a maximum amplitude for the entire channel. User interface system 200 may be further configured to and include instructions to provide automatic selection between displaying raw frequency information and displaying channel information based on user settings and/or current display settings. For example, if the x-axis is showing frequency information, frequency-specific metrics may be displayed. Likewise, if the x-axis is showing channel information, channel-specific metrics may be displayed.

User interface system 200 may be configured to and include instructions to display an interface for embedding user notes into a spectrum analyzer data file. User interface system 200 may include a selectable tab 814 that, when selected, displays a window for entering a note. FIG. 12 illustrates a detailed view of a window 1200 providing enterable fields 1202-1208 into which one or more notes may be entered. Enterable fields 1202-1208 may further include selectable icons 1210, 1212 for editing, deleting and/or any executing any other function with respect to note data that may be desired. An embedded note may be tagged with a timestamp 1214 and/or an author ID (not shown) or other such identifying information (e.g., computer identifier, IP address, etc.), allowing a viewer to determine who authored each note. An embedded note may be displayed on the interface and may provide a link to an associated timestamp for a selected note. User interface system 200 may display a note from each user in a different color, or provide a tag or other unique identifier to allow a user to quickly find a note from another specific user. User interface system 200 may allow a note to be embedded after receipt of a pause selection, indicating a desire to pause spectral data collection. User interface system 200 may also allow a note to be embedded during real or near-real time spectral data collection. For instance, user interface system 200 may receive an embedded a note describing the type of device associated with collected data, or Wi-Fi network information (e.g., the identity of a Wi-Fi network operating are on a specific channel).

User interface system 200 may be configured to and include instructions to display a selectable option for binding an embedded note to a specific data set in a spectrum analyzer data file. An embedded note may be relevant to an entire file, or be tied to a specific frequency (or frequency band), timestamp, amplitude or a mixture of these data axis. For example, a note could be specific to 802.11b channel 5, or to 12:21 am on Jan. 1, 1970.

User interface system 200 may be configured to and include instructions to automatically scale amplitude range as spectral data is received. Automatic adjustment of the amplitude range in the spectrum analyzer may provide a view of all or substantially all data within an applicable range in view without cutting off a portion of the data or utilizing excess screen space to provide the data.

User interface system 200 may be configured to and include instructions to display an entire recording timeframe when cropping. Recordings of spectral analysis data are similar to a video or audio clip in that the data has a specific time relationship. In order to create a clipping containing a subset of the original data the beginning and end time points must be specified. By displaying the data from the entire recording the user can quickly determine the desired timeframe for the clipping. Then, by displaying the data from the desired timeframe, the user may determine exactly what data will be contained in the clipping. In other words, as the user adjusts the beginning and end times of the clipping the view adjusts to show the data contained with the currently selected timeframe.

User interface system 200 may be further configured to and include instructions to display a selectable option for embedding images (e.g., from a webcam, uploaded photo, etc) into spectrum analyzer data file. Along with user notes, the spectrum analyzer data file may also contain an embedded image displaying the physical location where the recording took place, or of an encountered transmitter. User interface system 200 may also be configured to and include instructions to display a selectable option for embedding a preview image of a recording into the spectrum analyzer data file. Embedding a preview image of the spectrum analyzer data in the data file may allow the preview image to be displayed in the file open dialog. Embedding a preview image of a recording may further include displaying at least a portion of the content of each file and providing an option to select a previewed file for full viewing.

User interface system 200 may be further configured to and include instructions to provide spectrum analyzer data file sharing within the user interface. Data file sharing may be accomplished via an email with the data file attached, uploading to a server, or using a messaging protocol such as XMPP. The sharing may also occur in real-time or near real-time, allowing one or more collaborators to view the real-time data from a user hosting the spectral analysis data. The data may be transmitted from the host to a server and shared with one or more other collaborators, or shared directly (e.g., peer-to-peer) from the host. This real-time collaboration may allow collaborators to interact directly with the real-time data, adjust a the view, and/or otherwise remotely collaborate as if they were physically present at the spectrum analyzer location.

User interface system 200 may be further configured to and include instructions to display a magnified view of spectral data. When analyzing spectrum analyzer data it is useful to be able to examine a small area of data in greater detail. Magnified view may display an enlarged view of the subset of data as well as display additional information concerning the subset of data (such as average, current, and maximum amplitudes of the frequency/channel being magnified). User interface system may provide a dragable icon such as a magnifying glass icon configured to and including instructions to enlarge an area of data over which the icon is placed, or a clickable icon configured to enlarge an area of data over which, for example a mouse arrow is place after clicking the icon.

User interface system 200 may be further configured to and include instructions to display a spectral data information overlay. For example, when troubleshooting a wireless or Wi-Fi network, User interface system may provide wireless or Wi-Fi channel and network information overlaid over the spectral data. User interface system may group data into one or more subsets to be displayed when relevant. Information subsets may be overlaid onto the raw spectrum analyzer data, allowing the user to view the data in layers where each layer can be turned on or off allowing simultaneous viewing of any number of layers based on the user's current task. Determining which layers are displayed at any given time may be manually controlled by the user and/or automatically selected by the application based on the current task or user preferences.

User interface system 200 may include remote-control of a network-attached spectrum analyzer. User interface system 200 may utilize a network protocol to allow remote control of a network-attached spectrum analyzer. User interface system 200 may provide remote adjustment of interface settings (e.g., frequency settings, bandwidth resolution, etc).

User interface system 200 may be further configured to and include instructions to aggregate information from a plurality of spectrum analyzers and provide an aggregated display of data from at least a portion of the plurality of spectrum analyzers. If a user is monitoring multiple remote spectrum analyzers, aggregating the data from multiple analyzers into a single interface allows the user to compare the data from various analyzers as well as simultaneously monitor multiple analyzers without continuously switching windows (tabs, etc). Data aggregation may be utilized to monitor a wider frequency band than a single spectrum analyzer could monitor (at a given frequency step size, resolution bandwidth, and sweep time). Data aggregation may also be utilized to monitor a larger physical area than a single spectrum analyzer could monitor. Multiple spectrum analyzers connected to a single monitoring application could be used to triangulate a signal source to determine its exact location. By aggregating data from multiple spectrum analyzers and triangulating signal sources it is then possible to create three dimensional maps of signal sources and signal strengths.

User interface system 200 may be further configured to and include instructions to display a wireless oscilloscope display of spectral data. Wireless oscilloscope view may display the amplitude over time for a given input in a two-dimensional graph. Wireless oscilloscope view may be created by displaying the amplitude over time of a single frequency or frequency range (by aggregating multiple frequency readings together). Wireless oscilloscope display may provide assistance with analysis the change in signal strength over a given period of time.

User interface system 200 may be further configured to and include instructions to display a picture-in-picture view of spectral data. Spectrum analyzers typically allow the user to adjust the frequency range in view so the user may view a wide band for an overview or a narrow band for details. When a user zooms in to a narrow band, User interface system 200 may capture a wider band on a periodic basis so that the user may view the overview while being zoomed in looking at the detailed view. For example, 1 in every 10 frequency sweeps could sweep the wider band so that the narrow band is very detailed, but enough information is gathered to display a basic overview. This wide-band overview could then be displayed in a small window, similar to television displaying a picture-in-picture view of a second channel. The picture-in-picture could also be used to display a different narrow frequency band. For example, user interface system 200 may display a detailed view of spectral data captured on 802.11b channel 2, overlaid on spectral data captured on 802.11b channel 11.

User interface system 200 may further include a head-mounted display for coupling to a spectrum analyzer. By connecting a spectrum analyzer to a head-mounted display (e.g., a monocular-type head-mounted display), user interface system 200 may provide a view of spectral analysis data overlaid on an image of a device. Head mounted display may include directional antennas for signal direction determination. Head mounted display may also include an integrated camera suitable for recognizing objects in the physical area. User interface system 200 may provide one or more triangulation techniques for digitally highlighting a specific object transmitting a signal or displaying information on a head mounted display. Digital highlighting may assist with locating a source of a radio frequency signal.

User interface system 200 may further include a network attached spectrum analyzer. Spectrum analyzer may be a standalone hardware unit as described in U.S. patent application Ser. No. 11/605,839, filed Nov. 28, 2006. Spectrum analyzer may provide network connectivity (e.g., Ethernet, HomePlug, Wi-Fi, etc) to provide offloading of spectral data processing and/or display to a remote computer. Network attached spectrum analyzer may also provide monitoring of a plurality of remote spectrum analyzers from a single location.

FIGS. 14A-20 illustrate an operational flows representing a method 1400 related to FIGS. 1-13B. Method 1400 may be implemented within one or more computer program products stored on a computer readable medium usable with a programmable computer. The one or more computer program products may include computer-readable code embodied therein for displaying data in a graphical format, and the computer-readable code may further include instructions for implementing the method 1400. In FIG. 14 and in following figures that include various examples of operational flows, discussion and explanation may be provided with respect to the above-described examples of FIGS. 1-13B and/or with respect to other examples and contexts. However, it should be understood that the operational flows may be executed in a number of other environments and contexts, and/or in modified versions of FIGS. 1-13B. Also, although the various operational flows are presented in the sequence(s) illustrated, it should be understood that the various operations may be performed in other orders than those which are illustrated, or may be performed concurrently.

Figure 14B:
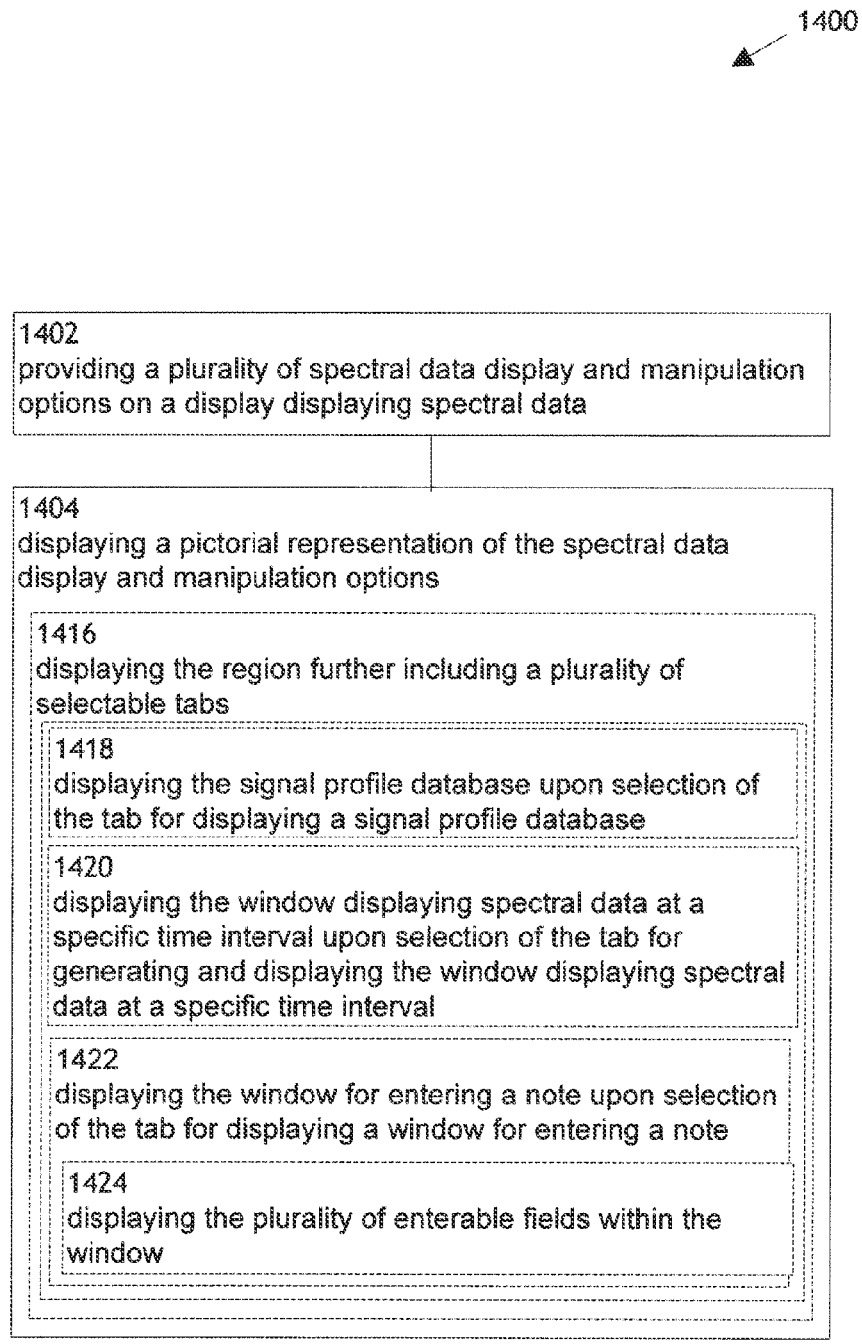

Method 1400 includes providing a plurality of spectral data display and manipulation options on a display displaying spectral data 1402. Providing a plurality of spectral data display and manipulation options on a display displaying spectral data may be via user interface software (FIG. 2). FIG. 14A further illustrates embodiments of the example operational flow 1400 of FIGS. 14A and 14B. FIG. 14A illustrates example embodiments where the operation 1402 may include at least one additional operation. Additional operations may include an operation 1406, an operation 1408, 1410, 1412 and/or an operation 1414. The operation 1406 depicts providing a region further including a plurality of selectable tabs. The operation 1408 depicts providing a tab displaying a signal profile database upon selection. Specifically, a first selectable data viewing and analysis enhancement option may be a searchable database of a plurality of signal profiles (e.g. a microwave signal, a 2.4 GHz telephone signal). A signal profile database tab may be selected, and a plurality of signal profiles may be displayed. Displayed signal profiles may be compared with captured spectral data for determining a source or device type of an interference signal.

Method 1400 may provide spectral analysis pattern recognition based on one or more images to compare signal profiles stored in the signal profile database with captured spectral data. Method 1400 may collect and store a plurality of signal patterns (e.g., microwave, cordless phone, baby monitor) in a signal profile database, and provide a selectable icon configured to display the signal profile database upon selection. Method 1400 may recognize a pattern in a spectrum and determine the type of device transmitting a given signal. To compile the database of signal profiles, user interface system 200 may utilize spectral analysis pattern recognition may be provided for raw data or for at least one image produced after raw data has been processed (e.g., an image displayed to a user on the interface). Method 1400 may utilize standard image recognition techniques to recognize a pattern in the data or create specialized techniques specific to spectrum analyzer data. Method 1400 may utilize any image recognition technique suitable for spectral analysis pattern recognition.

The operation 1410 depicts providing a tab generating and displaying a window displaying spectral data at a specific time interval upon selection. An additional selectable data viewing and analysis enhancement option may be a window displaying spectral data at a specific time interval. Method 1400 may detect a selected point on a displayed spectrograph and display spectral data information (e.g., frequency, amplitude, popularity) in the window.

The operation 1412 depicts providing a tab displaying a window for entering a note upon selection. The operation 1414 depicts providing a plurality of enterable fields within the window. Method 1400 may provide an interface for embedding user notes into a spectrum analyzer data file. FIG. 17 illustrates alternative embodiments of the example operational flow 1400. Additional operations may include an operation 1702, operation 1704, and/or an operation 1706. Operation 1702 depicts providing a selectable icon for editing note data (e.g., type of device, location of collected data). Operation 1704 depicts providing a selectable icon for deleting note data. Operation 1706 depicts providing a timestamp for entered note data. An embedded note may be tagged with a timestamp and an author ID, allowing a viewer to determine who authored each note. An embedded note may be displayed on the interface and may provide a link to an associated timestamp for a selected note. Method 1400 may display a note from each user in a different color, or provide a tag or other unique identifier to allow a user to quickly find a note from another specific user. Method 1400 may allow a note to be embedded after receipt of a pause selection, indicating a desire to pause spectral data collection. Method 1400 may also allow a note to be embedded during real or near-real time spectral data collection. For instance, method 1400 may receive an embedded a note describing the type of device associated with collected data, or Wi-Fi network information (e.g., the identity of a Wi-Fi network operating are on a specific channel).

Figure 15:
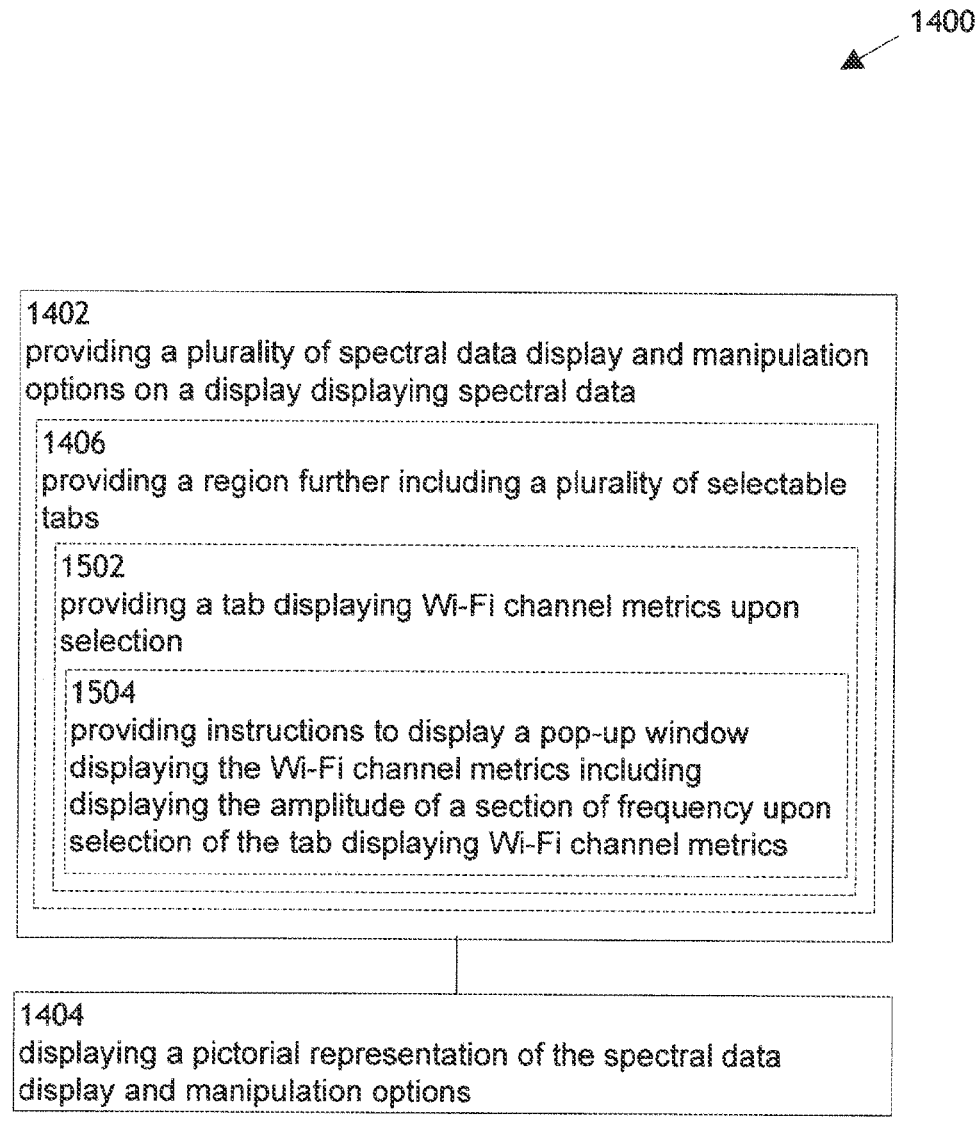
FIG. 15 is an operational flow illustrating a method for analyzing frequency spectrum data displayable by a user interface system.

FIG. 15 illustrates alternative embodiments of the example operational flow 1400. Additional operations may include an operation 1502, and/or an operation 1504. Operation 1502 depicts providing a tab displaying Wi-Fi channel metrics. Operation 1504 depicts providing instructions to display a pop-up window displaying the Wi-Fi channel metrics including displaying the amplitude of a section of frequency upon selection of the tab displaying Wi-Fi channel metrics. Providing Wi-Fi channel metrics may include providing the amplitude of a section of frequency, such as a wireless or Wi-Fi channel. By aggregating the data for the entire frequency range contained in a wireless or Wi-Fi channel, method 1400 may allow a user to view information including, but not limited to, an average and/or a maximum amplitude for the entire channel. Method 1400 may provide automatic selection between displaying raw frequency information and displaying channel information based on user settings and/or current display settings. For example, if the x-axis is showing frequency information, frequency-specific metrics may be displayed. Likewise, if the x-axis is showing channel information, channel-specific metrics may be displayed.

FIG. 16 illustrates alternative embodiments of the example operational flow 1400. Additional operations may include an operation 1602, an operation 1604, 1606, and/or an operation 1608. Operation 1602 depicts providing a manipulatable timeframe control for controlling an amount of spectral data and a specified time interval displayed on the user interface including, parsing a recording of spectral data based on displayed spectral data, and saving the parsed recording of spectral data. A user may select a start time, an end time, and an amount of spectral data to be included in a parsed recording or recorded segment. Parsed segment may be saved separately. Timeframe control may control displayed spectral data in each view (e.g., spectral, topographic, planar).

Operation 1604 depicts providing a partitionable time interval indicator. Providing a partitionable time interval indicator may include providing a slidable tab for partitioning a time interval of a spectrograph 1606. Method 1400 may also include detecting a selected time interval and displaying spectral data only for the selected time interval. Method 1400 may prevent the display from displaying spectral data outside of the selected time interval. Operation 1608 depicts providing an icon for providing a visual indication of whether a time interval is in an unlocked or a locked mode. For instance, method 1400 may include displaying a "lock" icon or other such graphic to indicate locking. Method 1400 may detect selection (e.g., clicking) of the lock icon and display spectral data collected prior to the time interval at which the lock selection was detected. Selected time interval may be adjustable, and method 1400 may detect an adjustment to the time interval and display spectral data associated with the adjusted time interval upon detecting a time interval adjustment.

Figure 18:
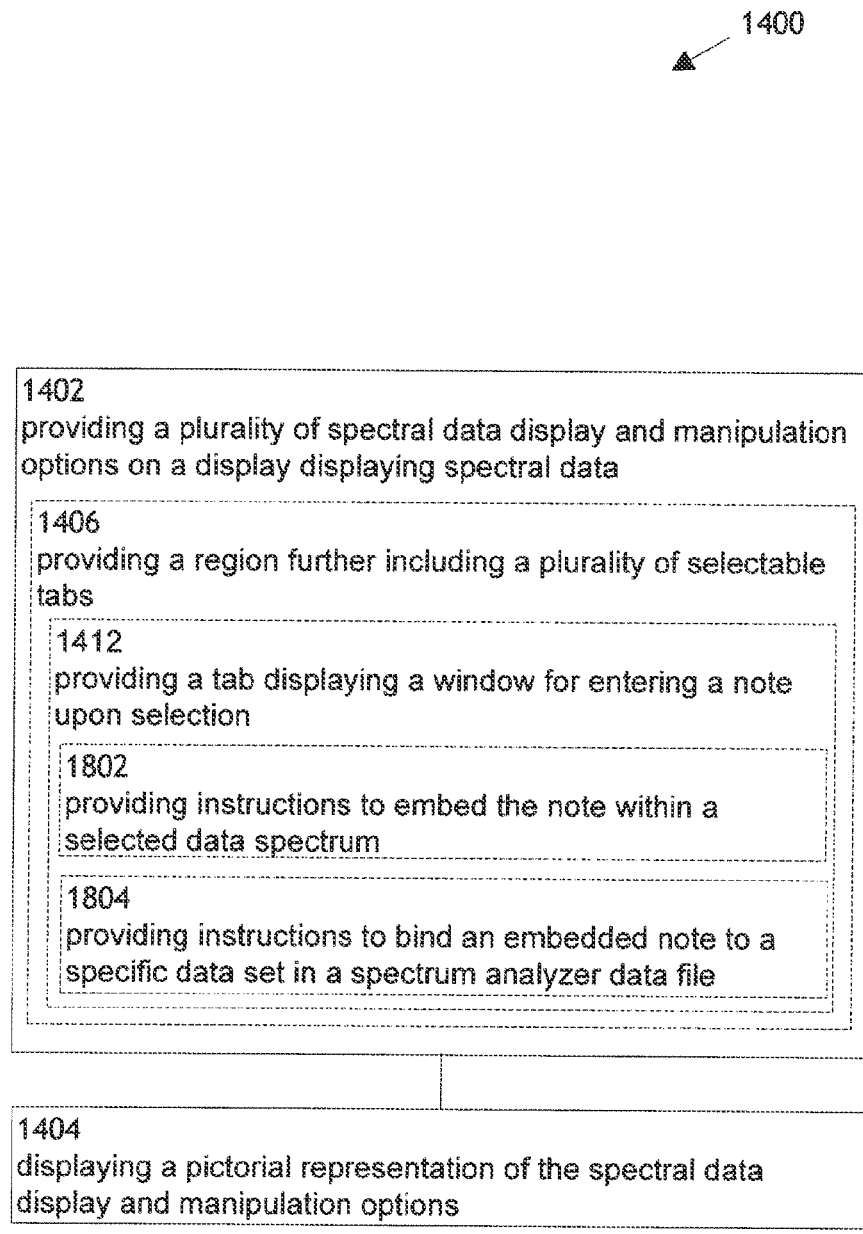
FIG. 18 is an operational flow illustrating a method for analyzing frequency spectrum data displayable by a user interface system.

FIG. 18 illustrates alternative embodiments of the example operational flow 1400. Additional operations may include an operation 1802, and/or an operation 1804. Operation 1804 depicts providing instructions to embed the note within a selected data spectrum. In one embodiment, method 1400 may provide a selectable option for binding an embedded note to a specific data set in a spectrum analyzer data file. An embedded note may be relevant to an entire file, or be tied to a specific frequency (or frequency band), timestamp, amplitude or a mixture of these data axis. For example, a note could be specific to 802.11b channel 5, or to 12:21 am on Jan. 1, 1970.

Operation 1804 depicts providing instructions to bind an embedded note to a specific data set in a spectrum analyzer data file. Along with user notes, the spectrum analyzer data file may also contain an embedded image displaying the physical location where the recording took place, or of an encountered transmitter.

Figure 19:
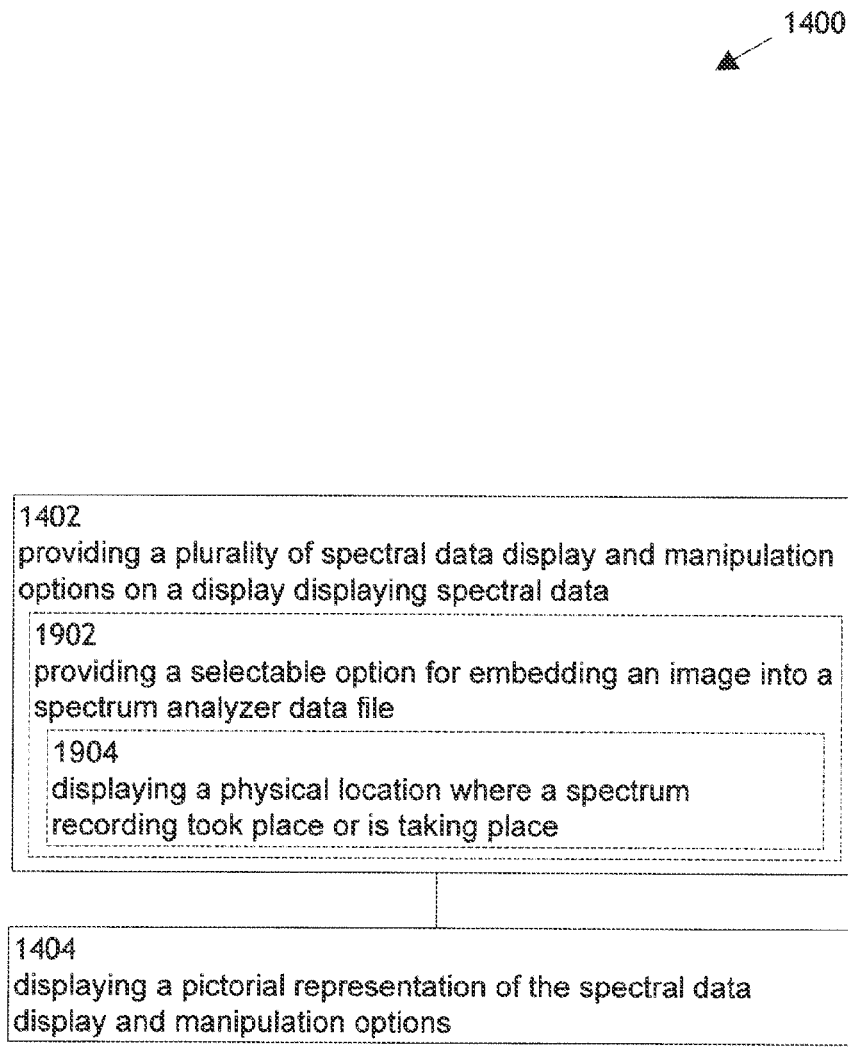
FIG. 19 is an operational flow illustrating a method for analyzing frequency spectrum data displayable by a user interface system.

FIG. 19 illustrates alternative embodiments of the example operational flow 1400. Additional operations may include an operation 1902, and/or an operation 1904. Operation 1902 depicts providing a selectable option for embedding an image into a spectrum analyzer data file. Operation 1904 depicts displaying a physical location where a spectrum recording took place or is taking place. Embedding a preview image of the spectrum analyzer data in the data file may allow the preview image to be displayed in the file open dialog. Embedding a preview image of a recording may further include displaying at least a portion of the content of each file and providing an option to select a previewed file for full viewing.

Method 1400 may further include displaying a pictorial representation of the spectral data display and manipulation options 1404. Displaying a pictorial representation of the spectral data display and manipulation options may be via a user interface processor (FIG. 2). FIG. 14B illustrates alternative embodiments of the example operational flow 1400. FIG. 14B illustrates example embodiments where the operation 1404 may include at least one additional operation. Additional operations may include an operation 1416, an operation 1418, 1420, 1422 and/or an operation 1424. Method 1400 may include displaying at least a portion of data in a region further including a plurality of selectable tabs 1416. Selectable tabs may provide toggling between at least two selectable data viewing and analysis enhancement options. Operation 1416 depicts displaying the region further including a plurality of selectable tabs. Operation 1418 depicts displaying the signal profile database upon selection of the tab for displaying a signal profile database. Operation 1420 depicts displaying the window displaying spectral data at a specific time interval upon selection of the tab for generating and displaying the window displaying spectral data at a specific time interval. Operation 1422 depicts displaying the window for entering a note upon selection of the tab for displaying a window for entering a note. Operation 1424 depicts displaying the plurality of enterable fields within the window.

FIG. 20 illustrates alternative embodiments of the example operational flow 1400. Additional operations may include an operation 2002, and/or an operation 2004. Operation 2002 depicts providing a plurality of manipulation instructions. Operation 2004 depicts providing real-time spectrum analyzer data file sharing within the user interface via at least one of an e-mail with a data file attached, uploading a data file to a server, or using a messaging protocol to share a data file. Providing a plurality of manipulation instructions to the user interface processor to provide manipulation of the displayed spectral data may be via a user interface instruction engine (FIG. 2). The plurality of data display and manipulation instructions may be received from a control device connected to a computing system and the manipulation of the displayed spectral data is based on a user response to the displayed spectral data manipulation options or a pre-determined selection of the displayed spectral data display manipulation options.

Method 1400 may provide spectrum analyzer data file sharing within the user interface. Data file sharing may be accomplished via an email with the data file attached, uploading to a server, or using a messaging protocol such as XMPP. The sharing may also occur in real-time or near real-time, allowing one or more collaborators to view the real-time data from a user hosting the spectral analysis data. The data may be transmitted from the host to a server and shared with one or more other collaborators, or shared directly (e.g., peer-to-peer) from the host. This real-time collaboration may allow collaborators to interact directly with the real-time data, adjust a view, and/or otherwise remotely collaborate as if they were physically present at the spectrum analyzer location.

Method 1400 may include automatic scaling of amplitude range. Automatic adjustment of the amplitude range in the spectrum analyzer may provide a view of all or substantially all data within an applicable range in view without cutting off a portion of the data or utilizing excess screen space to provide the data.

Method 1400 may display an entire recording timeframe when cropping. Recordings of spectral analysis data are similar to a video or audio clip in that the data has a specific time relationship. In order to create a clipping containing a subset of the original data the beginning and end time points must be specified. By displaying the data from the entire recording the user may quickly determine the desired timeframe for the clipping. Then, by displaying the data from the desired timeframe, the user may determine exactly what data will be contained in the clipping. In other words, as the user adjusts the beginning and end times of the clipping the view adjusts to show the data contained with the currently selected timeframe.

Method 1400 may provide a magnified view of spectral data. When analyzing spectrum analyzer data it is useful to be able to examine a small area of data in greater detail. Magnified view may display an enlarged view of the subset of data as well as display additional information concerning the subset of data (such as average, current, and maximum amplitudes of the frequency/channel being magnified). Method 1400 may provide a dragable icon such as a magnifying glass icon configured to and including instructions to enlarge an area of data over which the icon is placed, or a clickable icon configured to and including instructions to enlarge an area of data over which, for example a mouse arrow is place after clicking the icon.

Method 1400 may provide a spectral data information overlay. For example, when troubleshooting a wireless or Wi-Fi network, method 1400 may provide wireless or Wi-Fi channel and network information overlaid over the spectral data. Method 1400 may group data into one or more subsets to be displayed when relevant. Information subsets may be overlaid onto the raw spectrum analyzer data, allowing the user to view the data in layers where each layer may be turned on or off allowing simultaneous viewing of any number of layers based on the user's current task. Determining which layers are displayed at any given time may either be manually controlled by the user or automatically selected by the application based on the current task or user preferences.

Method 1400 may provide remote-control of a network-attached spectrum analyzer. Method 1400 may utilize a network protocol to allow remote control of a network-attached spectrum analyzer. Method 1400 may provide remote adjustment of interface settings (e.g., frequency settings, bandwidth resolution, etc).

Method 1400 may aggregate information from a plurality of spectrum analyzers and provide an aggregated display of data from at least a portion of the plurality of spectrum analyzers. If a user is monitoring multiple remote spectrum analyzers, aggregating the data from multiple analyzers into a single interface allows the user to compare the data from various analyzers as well as simultaneously monitor multiple analyzers without continuously switching windows (tabs, etc). Data aggregating may be utilized to monitor a wider frequency band than a single spectrum analyzer could monitor (at a given frequency step size, resolution bandwidth, and sweep time). Data aggregating may be utilized to monitor a larger physical area than a single spectrum analyzer could monitor. Multiple spectrum analyzers connected to a single monitoring application could be used to triangulate a signal source to determine its exact location. By aggregating data from multiple spectrum analyzers and triangulating signal sources it is then possible to create three dimensional maps of signal sources and signal strengths.

Method 1400 may include providing a wireless oscilloscope display of spectral data. Wireless oscilloscope view may display the amplitude over time for a given input in a two-dimensional graph. Wireless oscilloscope view may be created by displaying the amplitude over time of a single frequency or frequency range (by aggregating multiple frequency readings together). This could be useful in analyzing the change in signal strength over a given period of time.

Method 1400 may provide a picture-in-picture view of spectral data. Spectrum analyzers typically allow the user to adjust the frequency range in view so the user may look at a wide band for an overview or a narrow band for details. When a user zooms in to a narrow band, method 1400 may capture a wider band on a periodic basis so that the user may see the overview while being zoomed in looking at the detailed view. For example, 1 in every 10 frequency sweeps could sweep the wider band so that the narrow band is very detailed, but enough information is gathered to display a basic overview. This wide-band overview could then be displayed in a small window, similar to television displaying a picture-in-picture view of a second channel. The picture-in-picture could also be used to display a different narrow frequency band. For example, method 1400 may display a detailed view of spectral data captured on 802.11b channel 2, overlaid on spectral data captured on 802.11b channel 11.

Method 1400 may include providing a network attached spectrum analyzer for detecting and collecting spectral data. Network attached spectrum analyzer may be implemented with user interface system 200 for enhanced collection and analysis of spectral data. Spectrum analyzer may be a standalone hardware unit as described in U.S. patent application Ser. No. 11/605,839, filed Nov. 28, 2006. Spectrum analyzer may provide network connectivity (e.g., Ethernet, HomePlug, Wi-Fi, etc) to provide offloading of spectral data processing and/or display to a remote computer. Network attached spectrum analyzer may also provide monitoring of a plurality of remote spectrum analyzers from a single location.

Method 1400 may include providing a head-mounted display for coupling to a spectrum analyzer. By connecting a spectrum analyzer to a head-mounted display (e.g., a monocular-type head-mounted display), method 1400 may provide head mounted display for viewing of spectral analysis data overlaid on an image of a device. Head mounted display may include directional antennas for signal direction determination. Head mounted display may also include an integrated camera suitable for recognizing objects in the physical area. Method 1400 may provide one or more triangulation techniques for digitally highlighting a specific object transmitting a signal or displaying information on a head mounted display. Digital highlighting may assist with locating a source of a radio frequency signal.

FIGS. 21-32 illustrate further implementations of the user interface system 200 described in FIGS. 1-20. Further implementations may be implemented within one or more computer program products stored on a computer readable medium usable with a programmable computer. The one or more computer program products may include computer-readable code embodied therein for displaying data in a graphical format, and the computer-readable code may further include instructions for implementing a method corresponding with the implementations illustrated in FIGS. 21-32.

Figure 21:
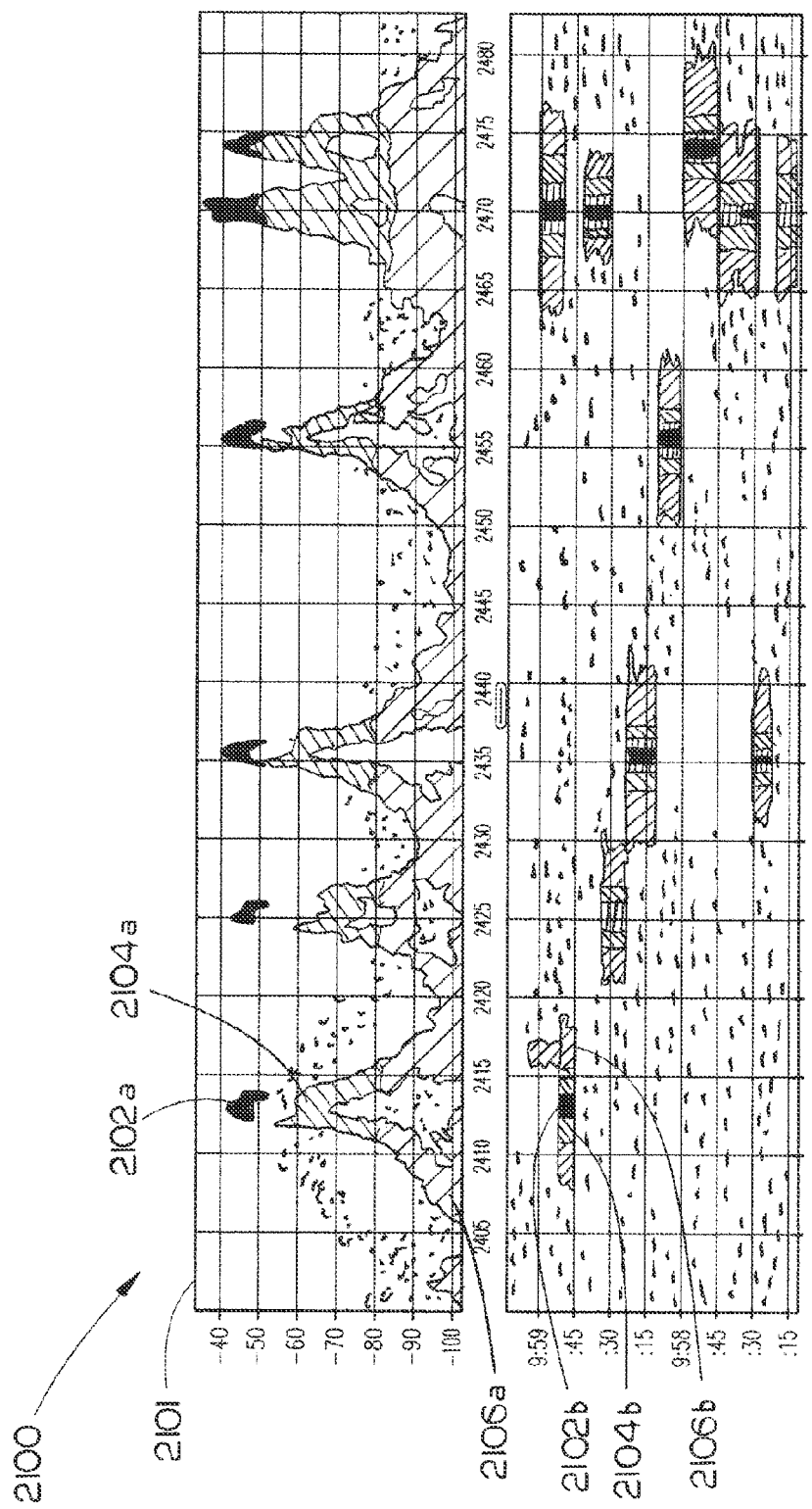
FIG. 21 is an illustration of an analysis of detected frequency spectrum data displayable by a user interface system.

FIG. 21 is an illustration 2100 of an analysis of detected frequency spectrum data displayable by a user interface system 200. User interface system 200 may provide color matching between graphs displaying frequency spectrum data, providing visual consistency for two or more characteristics of the frequency spectrum data. For instance, user interface system 200 may display a graph displaying density information for one or more frequency spectrums. Density information (or other frequency spectrum information) may be displayed in an amplitude versus frequency graph 2101 displaying a density of each frequency/amplitude coordinate during a displayed time period. Density information may be displayed utilizing any color scheme for differentiating among the various densities of the displayed frequency spectrums. In one embodiment, user interface system may generate a blue hue to represent a low density (represented in 2101 of FIG. 21 as the region encompassed by backward slanting hash marks 2106a), a red hue to represent a high density (represented in 2101 of FIG. 21 as the solid fill region 2102a), and green, yellow, and/or orange hues to represent varying densities between the high and low density (represented in 2101 of FIG. 21 as the region encompassed by forward slanting hash marks 2104a). The range of colors utilized to represent densities may vary and may not be limited to colors typically used to show density in visual displays.

To maintain visual consistency for two or more characteristics of the frequency spectrum data, user interface system 200 may display a waterfall type spectrograph (hereinafter sometimes referred to as a "waterfall graph" or "waterfall spectrum display") 2108 (shown in the bottom half of FIG. 21) representing frequency versus time and utilize the same color scale to represent the amplitude of the signal at each frequency/time coordinate. For instance, amplitude information may be displayed utilizing any color scheme for differentiating among the various densities of the displayed frequency spectrums. In one embodiment, user interface system may generate a blue hue to represent a low density (represented in 2108 of FIG. 21 as the region encompassed by backward slanting hash marks 2106b), a red hue to represent a high density (represented in 2108 of FIG. 21 as the solid fill region 2102b), and green, yellow, and/or orange hues to represent varying densities between the high and low density (represented in 2108 of FIG. 21 as the region encompassed by forward slanting hash marks 2104b). The range of colors utilized to represent densities may vary and may not be limited to colors typically used to show density in visual displays.

A user may then link data points in the waterfall graph display with data points in the spectrum density graph display. In one embodiment, user interface system 200 may map one or more colors to the hue saturation value (HSV) color model. For instance, in the waterfall graph display, amplitude may be mapped to the hue of the color. A saturation value may be set a fixed value (e.g., 100% saturation may provide the brightest color). In a corresponding spectrum density graph display, amplitude may also be mapped to hue. For instance, a frequency spectrum density may be mapped to a value and/or a saturation. In this embodiment, a low density point may be displayed as a darker point having the same hue. A user may then be able to link corresponding data points across multiple view of the same frequency spectrum data (e.g., red data points a waterfall graph display may link to red data points in a spectrum density graph display).

In an additional embodiment, the same color mapping between waterfall graph display and the spectrum density graph display may be used for amplitude, but the density may be mapped to an alpha value, thus making low density points partially transparent. In this embodiment, low density points may fade into the background, while the high density points may be more visually apparent.

Figure 22:
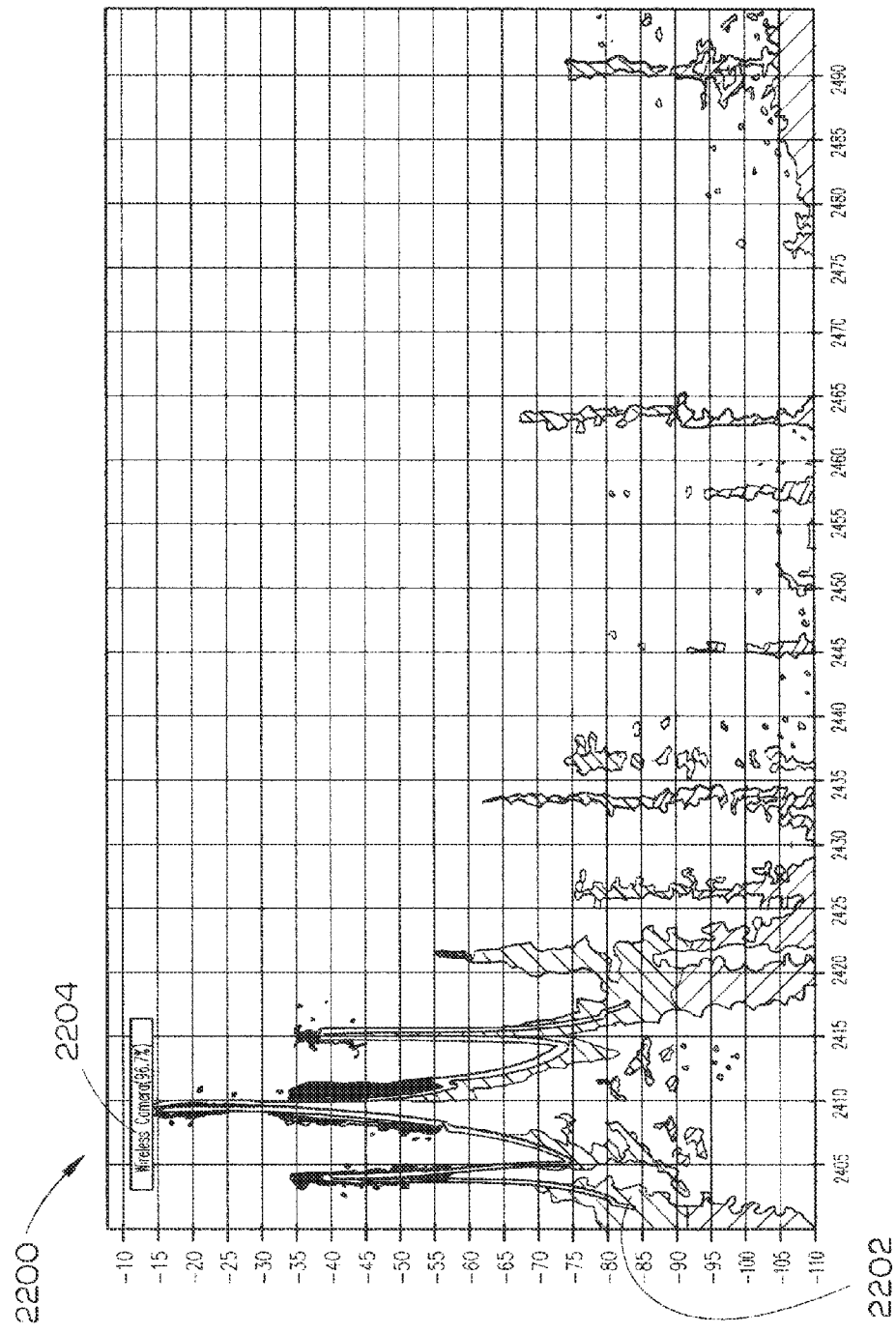
FIG. 22 is an additional illustration of an analysis of detected frequency spectrum data displayable by a user interface system.

FIG. 22 is an additional illustration 2200 of an analysis of detected frequency spectrum data displayable by a user interface system 200. User interface system 200 may provide a display including further combination of multiple data sets visible in one display. For instance, user interface system 200 may provide a visual representation of captured spectrum data 2202. The captured spectrum data may be displayed on a graph of frequency versus amplitude. The user interface system 200 may then overlay device classification information 2204 (e.g., as in FIG. 22, the "wireless camera" classification) onto the visual representation of captured spectrum data for to allow a visual determination of device classification accuracy. Any other device transmitting or receiving a wireless signal may be detected, classified, and overlaid onto a graph displaying frequency versus amplitude for captured spectrum data, providing information for as many devices as may be desired.

Figure 23:
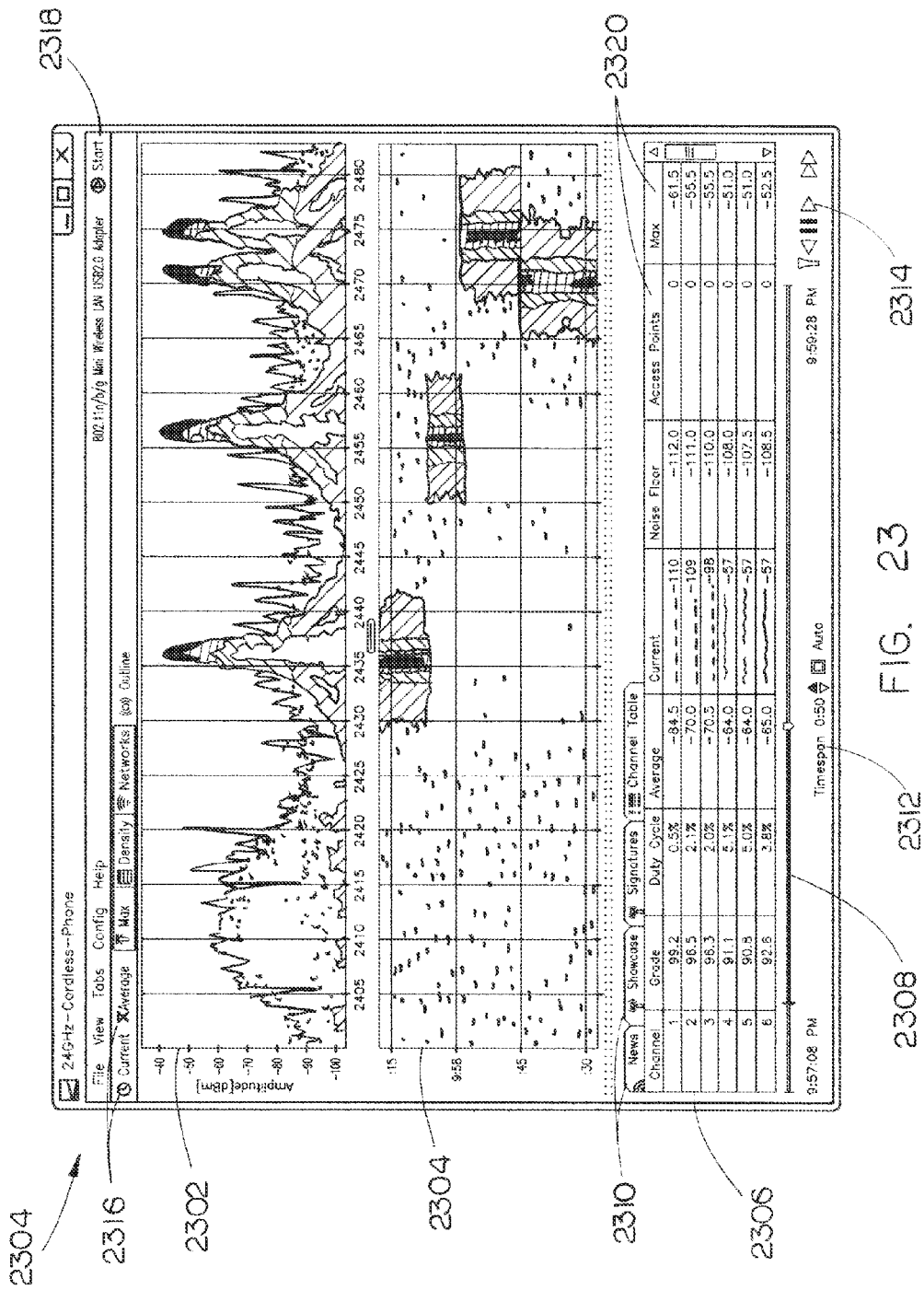
FIG. 23 is an additional illustration of an analysis of detected frequency spectrum data displayable by a user interface system.

FIG. 23 is an additional illustration 2300 of an analysis of detected frequency spectrum data displayable by a user interface system 200. In one embodiment, user interface system 200 may provide any combination of graphical displays, including a frequency versus amplitude display 2302, a waterfall spectrum display 2304, and/or an informational table 2306 displaying a table of one or more characteristics of one or more signals detected by the system. Informational table may include one or more tabs 2310 (e.g., news, showcase, signatures, channel table, etc.) displaying signal or other information. In the embodiment shown, a Channel Table tab may be activated, and the user interface system 200 may display channel information 2320 (e.g., channel, grade, duty cycle, average, current, noise floor, access points, max, etc.). User interface system 200 may also display a playback bar 2308 displaying a current position in time of a captured frequency spectrum represented by a marker at the relative position between the beginning and end markers, providing a visual representation of the currently viewed file location. User interface system may also display a timespan 2312, which may be adjustable by selecting an "up" or "down" timespan arrow icon, or may be set to "auto". User interface system 200 may also include one or more playback controls 2314 (e.g., icons for playing, pausing, rewinding, fast forwarding, etc.). User interface system 200 may also include a start/stop icon 2318 that may be activated by clicking or otherwise selecting the icon. User interface system 200 may also include one or more selectable tabs 2316 for displaying signal information (e.g., current, average, max, density, networks, outline, etc.).

Figure 24:
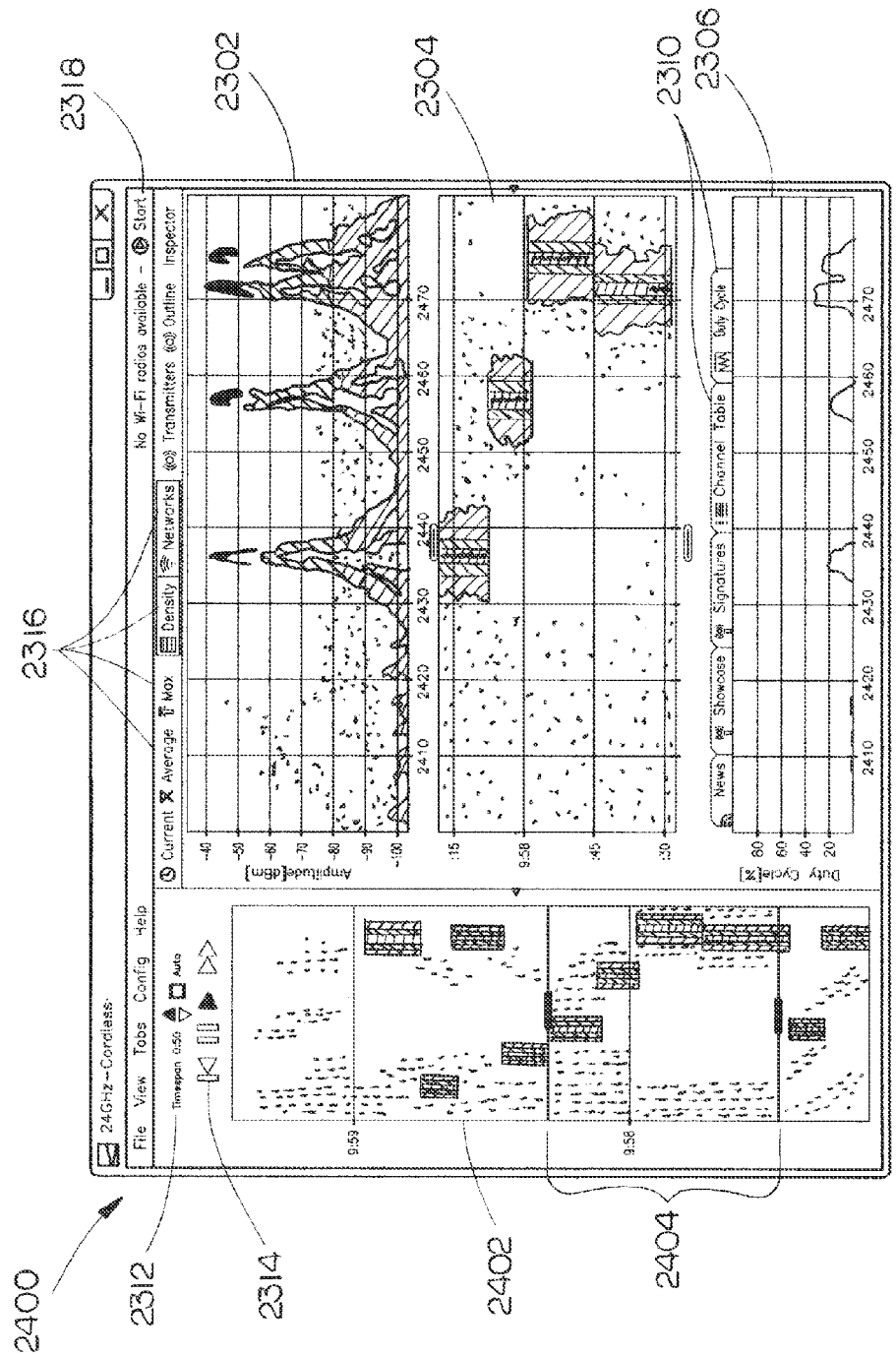
In FIG. 24, an additional illustration of an analysis of detected frequency spectrum data displayable by a user interface system.

In FIG. 24, an additional illustration 2400 of an analysis of detected frequency spectrum data displayable by a user interface system 200 is shown. User interface system 200 may further provide playback capabilities in a waterfall graph display 2402. In this manner, the time-specific nature of the waterfall graph display 2402 may be utilized to create a playback bar manipulatable when viewing the waterfall graph display 2402. A waterfall graph display may be generated for all or a portion of recorded frequency spectrum data. The waterfall graph display 2402 may be positioned along one side a display screen, such that a main viewing area 2404 of the display may display a current timespan of the data. Waterfall graph display 2402 may include one or more portions (e.g., 2404) capable of being selected to provide a user with a detailed display of one or more time spans of collected spectrum data. Waterfall graph display 2402 may be compressed as necessary (e.g., as the total amount of time increases). In preferred embodiments, user interface system 200 may scale the waterfall graph display 2402 as an image, or compress the data represented in the waterfall graph display. Utilizing a waterfall graph display as a time bar positioned along with current or previously recorded frequency spectrum data provides a high-level view of all or a desired portion of captured frequency spectrum data (e.g., saved as a file). In this manner, user interface system 200 provides the user with the capability to visually determine if or when a change has occurred in a wireless environment. User interface system 200 may provide a manipulation option for reviewing portion of the previously recorded or currently viewed spectrum data by selecting a portion of the waterfall graph display 2402. Selected portions may then be replayed for review.

Figure 25:
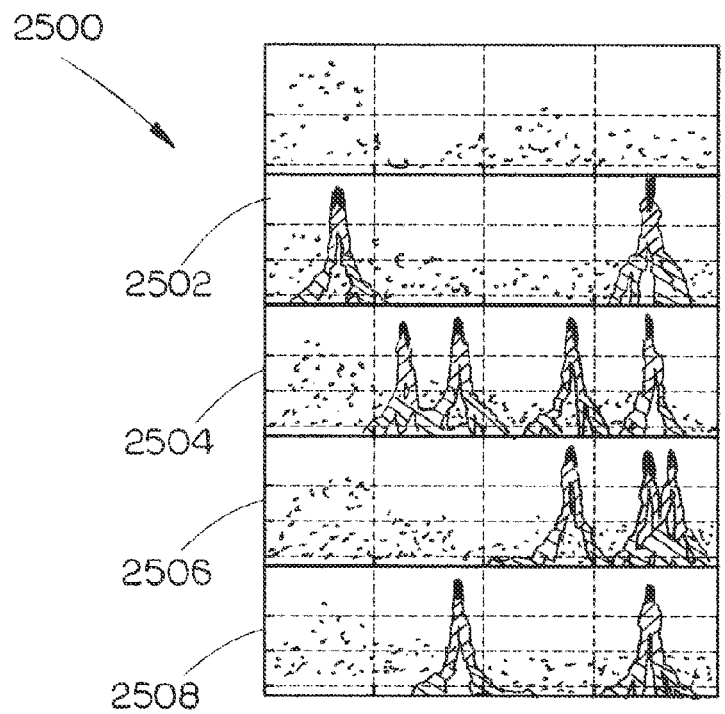
FIG. 25 is an illustration of a screen shot of the user interface system displaying a plurality of thumbnails of a spectrum density graph display.
Figure 26:
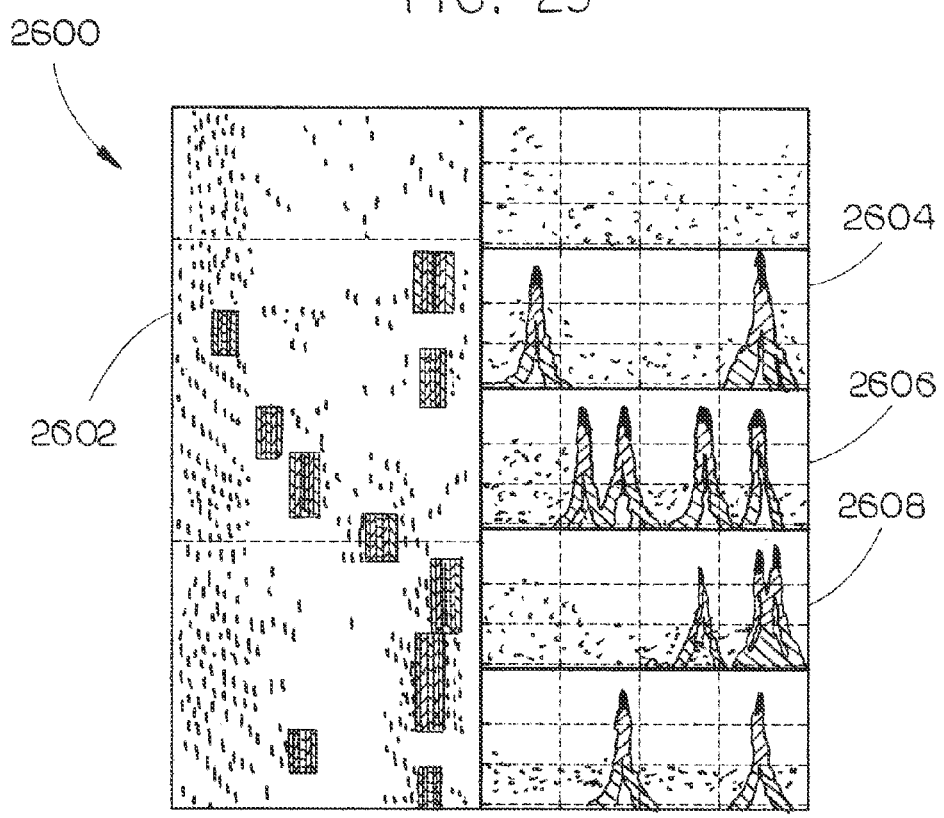
FIG. 26 is an illustration of a screen shot of the user interface system displaying a spectrum waterfall graph display and a plurality of spectrum density graph display thumbnails.

FIGS. 25 and 26 are additional illustrations 2500 and 2600 of an analysis of detected frequency spectrum data displayable by a user interface system 200, further showing additional embodiments for displaying a visual playback bar. User interface system 200 may generate one or more user selectable thumbnail versions (e.g., 2502, 2504, 2506, and 2508) of points in time of captured frequency spectrum data. For instance, FIG. 25 is an illustration of a screen shot of the user interface system displaying a plurality of thumbnails (e.g., 2502, 2504, 2506, and 2508) of a spectrum density graph display. FIG. 26 is an illustration of a screen shot of the user interface system 200 displaying a spectrum waterfall graph display 2602 and a plurality of spectrum density graph display thumbnails (e.g., 2604, 2606, and 2608). A user may then be able to select a thumbnail and the user interface system 200 will generate that portion of the captured frequency spectrum data represented by the thumbnail. User interface system 200 may or may not indicate a starting, ending, or duration time (e.g., via a timestamp) for one or more thumbnails. User interface system 200 may generate a thumbnail version of any point in time of any graphical display generated by the user interface system. The visual playback bars of FIGS. 24-26 may be combinable and/or viewable in any combination or separately.

Figure 27:
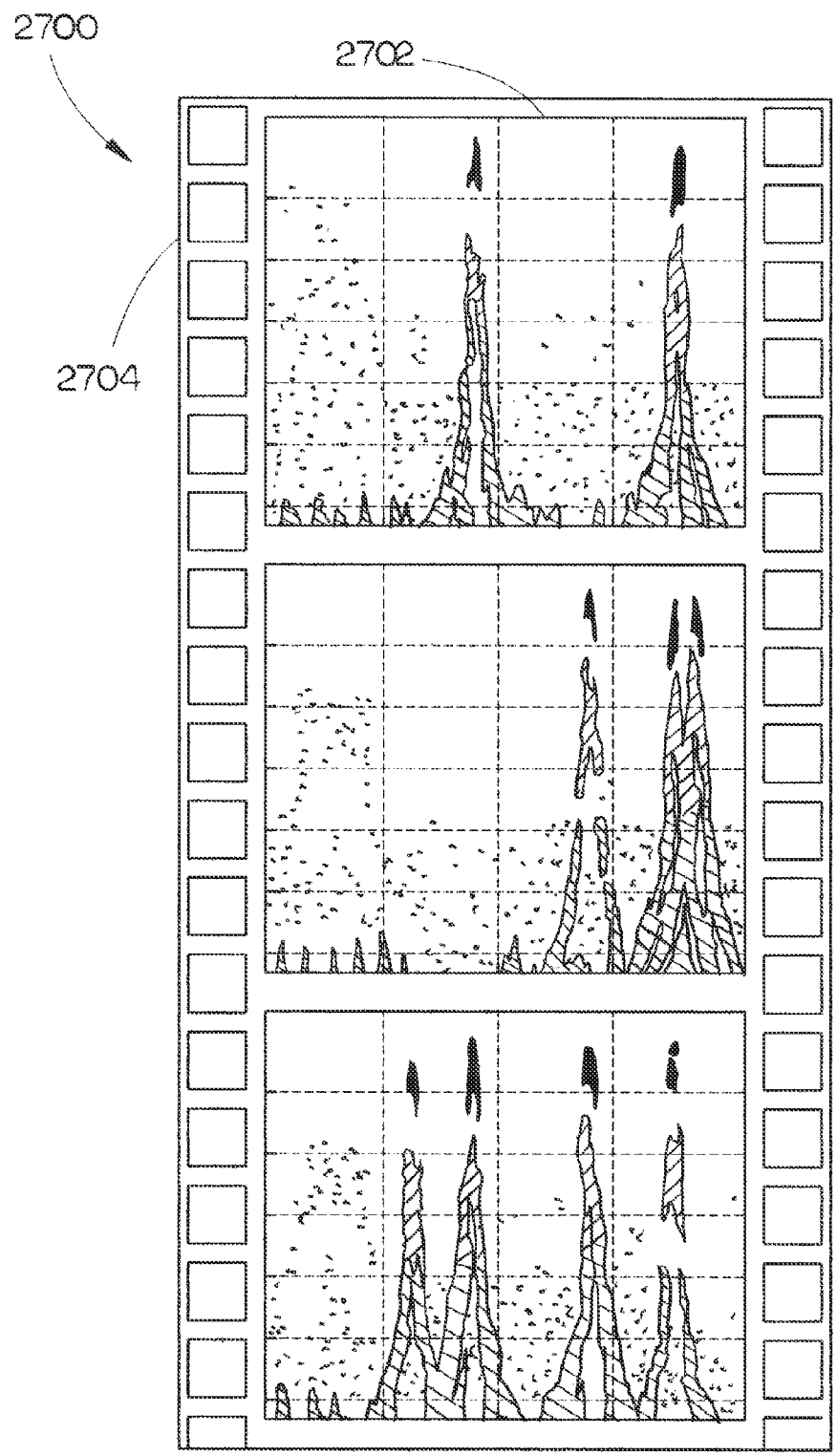
FIG. 27 is an additional illustration of a screen shot of a further embodiment of detected frequency spectrum data displayable as a thumbnail by a user interface system.

FIG. 27 is an additional illustration 2700 of a screen shot of a further embodiment of detected frequency spectrum data displayable as a thumbnail 2702 by a user interface system 200. User interface system 200 may generate a thumbnail version 2702 of captured frequency spectrum data and may generate one or more side or border embellishments 2704 having the visual appearance of a film strip. A film strip thumbnail 2702 may provide the user with a visual cue that the image viewed in this display is snapshot representation of captured data.

Figure 28:
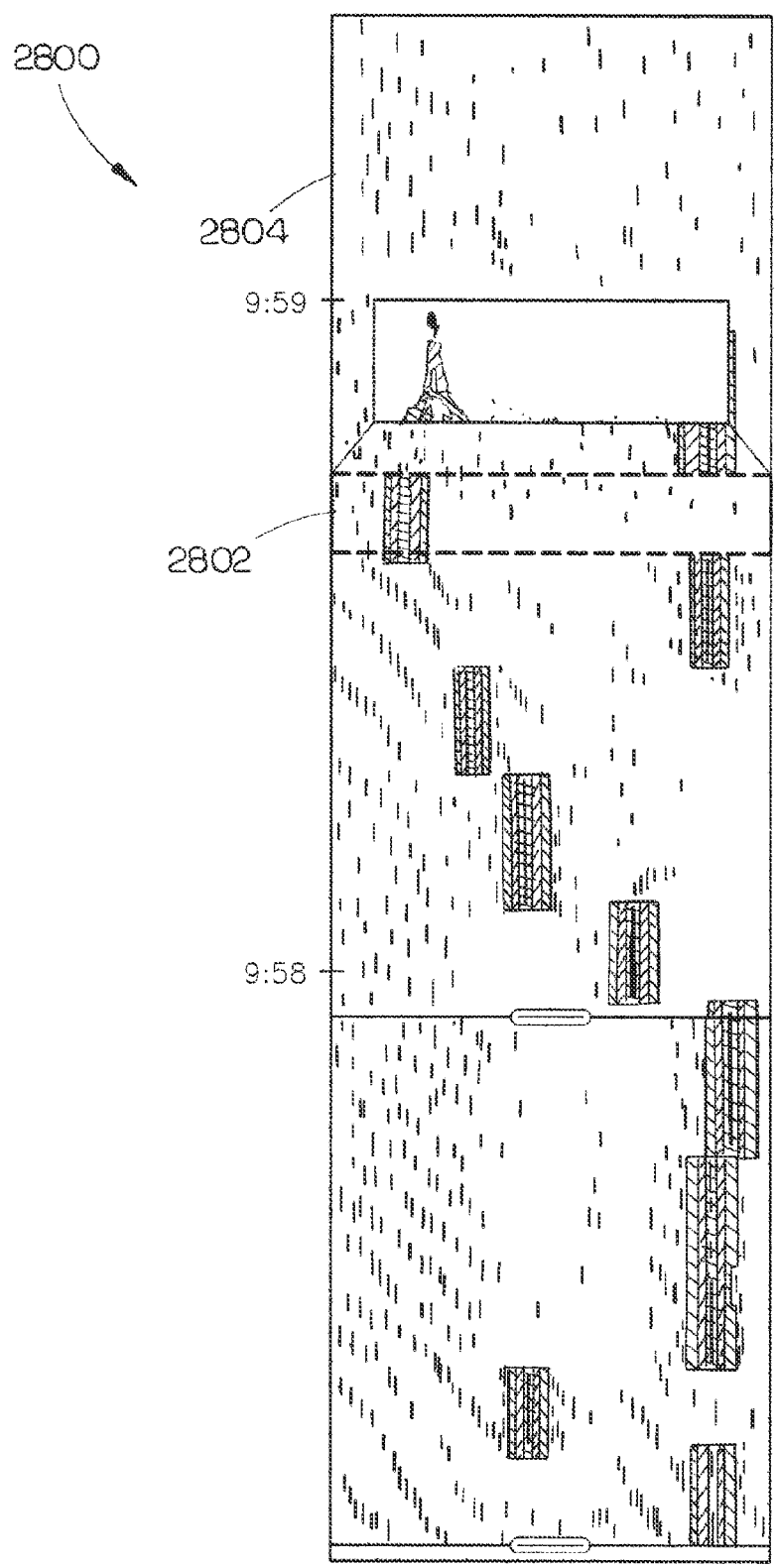
FIG. 28 is an additional illustration of an analysis of detected frequency spectrum data displayable as a thumbnail by a user interface system.

FIG. 28 is an additional illustration 2800 of an analysis of detected frequency spectrum data displayable as a thumbnail by a user interface system 200. User interface system 200 may generate a pop-up or pop-out version 2802 of a thumbnail 2804 that may be viewable when a selection tool (e.g., mouse, finger, etc.) is hovering over a portion of the graphical display. For instance, a pop-up thumbnail 2802 may be available in a spectrum waterfall graph display-based visual playback bar (e.g., 2402 of FIG. 24). In this manner, user interface system 200 may provide additional spectrum detail in a pop out/pop up display 2802 regarding a specific or selected time segment of data without requiring playback of the time segment (e.g., in another screen, or requiring additional space to simultaneously display both a spectrum waterfall thumbnail version and graph thumbnail version of the visual playback bar).

Figure 29:
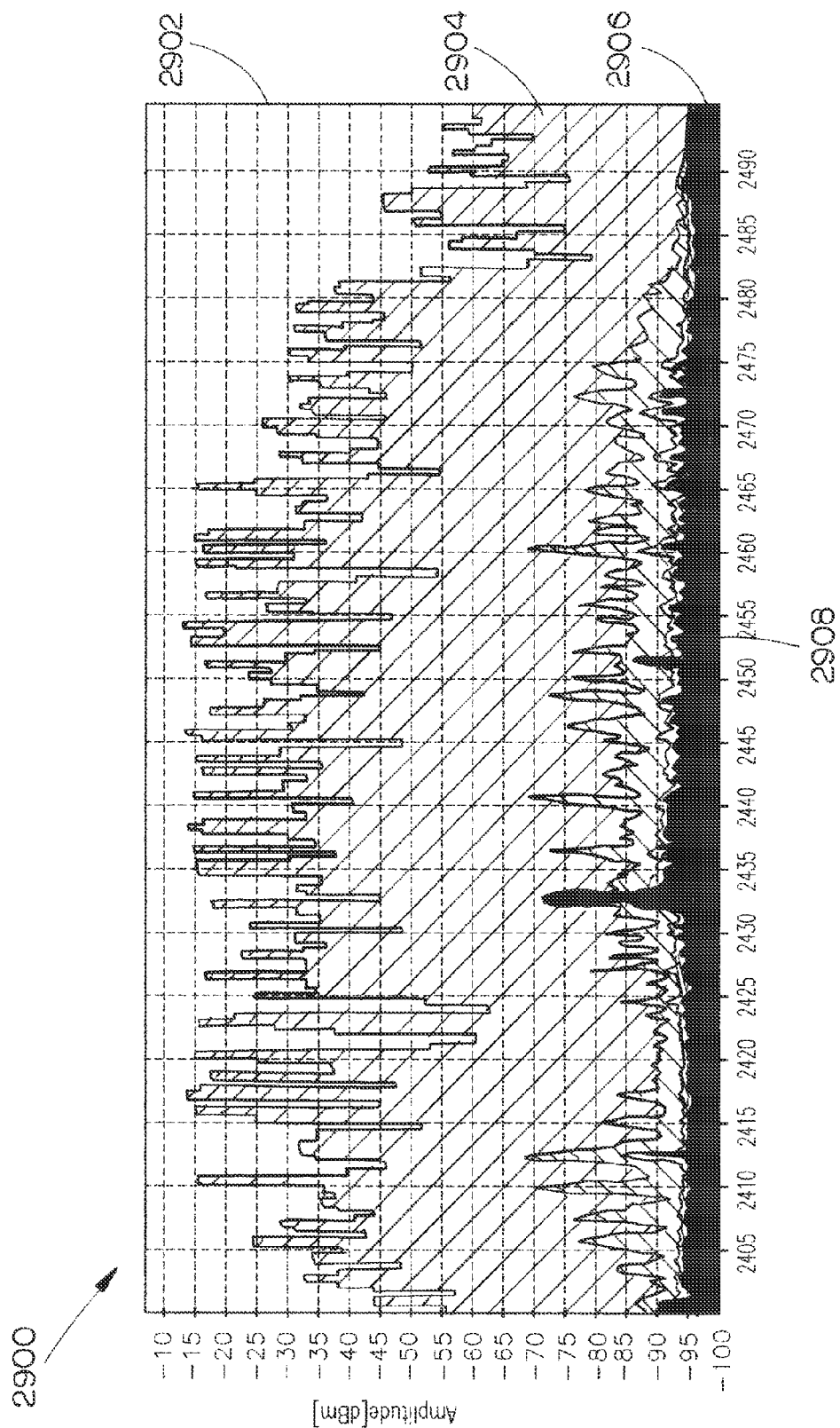
FIG. 29 is an additional illustration of an analysis of detected frequency spectrum data displayable by a user interface system.

FIG. 29 is an additional illustration 2900 of an analysis of detected frequency spectrum data displayable by a user interface system 200. User interface system 200 may display a visual representation 2902 of a duty cycle for one or more amplitude levels. Visual duty cycle representation 2902 may display a duty cycle for each amplitude level FIG. 29 shows a duty cycle displayed on a color scale from, for example blue (0%) (represented by region 2904 having backward hash marks) to red (100%) (represented by region 2906 having a solid fill). Enhanced duty cycle display 2902 may generate duty cycle information from detected frequency spectrum information and may also include density information (represented by a color scale ranging from, for example, red to blue) or other spectrum information at each frequency as desired. For example, a constant signal 2908 may be present at 2451 MHz. The constant signal 2908 may be below a typical line graph amplitude threshold of −80 dBm, and may not be noticeable to a user when compared to one or more surrounding frequency. In an enhanced duty cycle fill graph, the constant signal 2908 at 2451 MHz may be easily viewable by a user.

Figure 30:
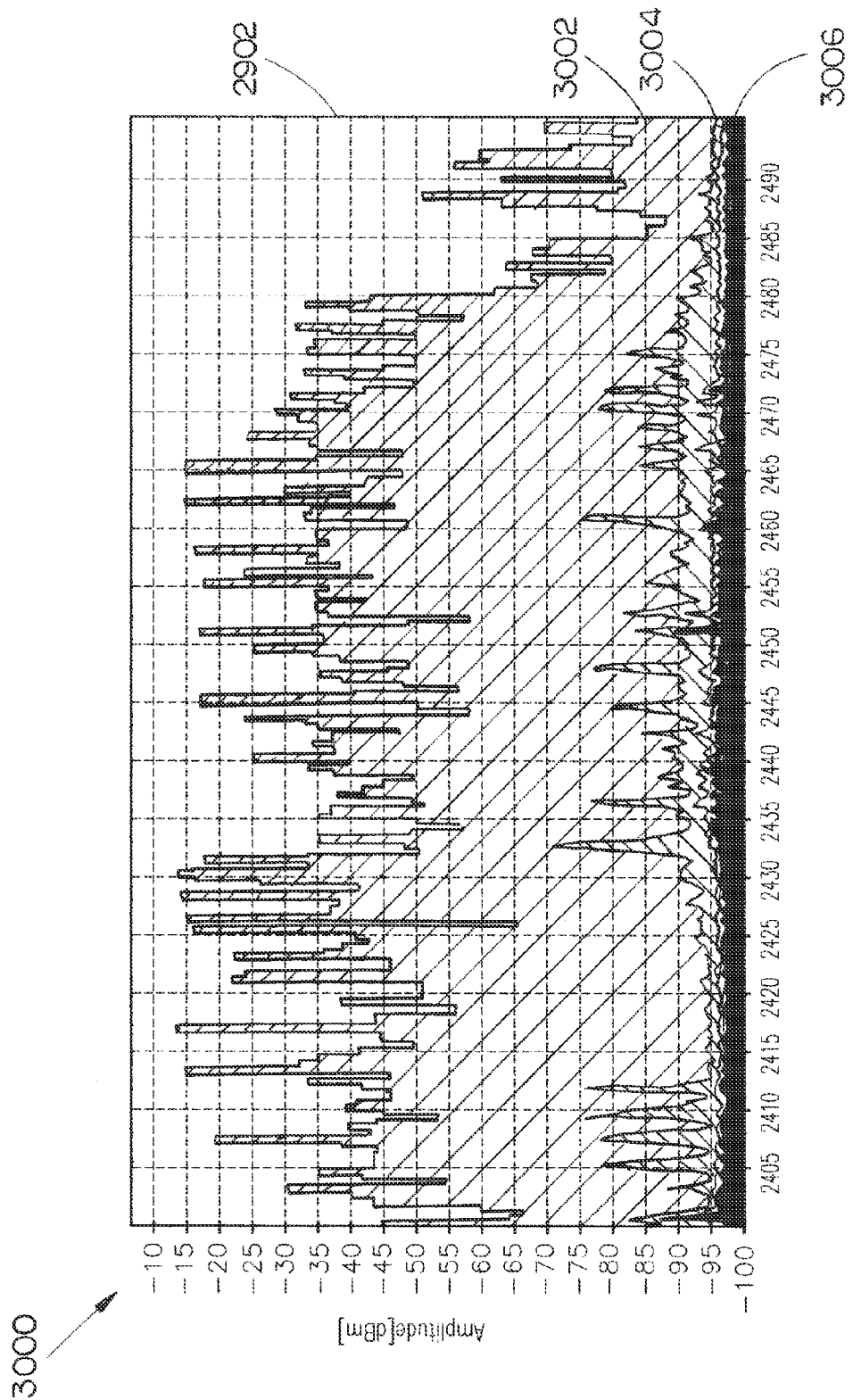
FIG. 30 is an additional illustration of an analysis of detected frequency spectrum data displayable by a user interface system.

FIG. 30 is an additional illustration of an analysis of detected frequency spectrum data displayable by a user interface system 200. As noted above, user interface system 200 may provide an enhanced duty cycle fill graph 2902. The enhanced duty cycle fill graph 2902 described above may further provide density information by incorporating density information for each frequency amplitude point into the coloration of the duty cycle. For example, utilizing a HSV color scale (Hue, Saturation, Value), FIG. 30 illustrates a mapping of the duty cycle with the frequency at each amplitude onto the a designated hue and the density at that specific frequency/amplitude point onto a designated value (colors represented, for example, by regions 3002, 3004, and 3006). In the embodiment shown, saturation is set to on or around 100%. In other embodiments, saturation may be preselected by the system 200 and/or selectable or modifiable by a user.

Figure 31:
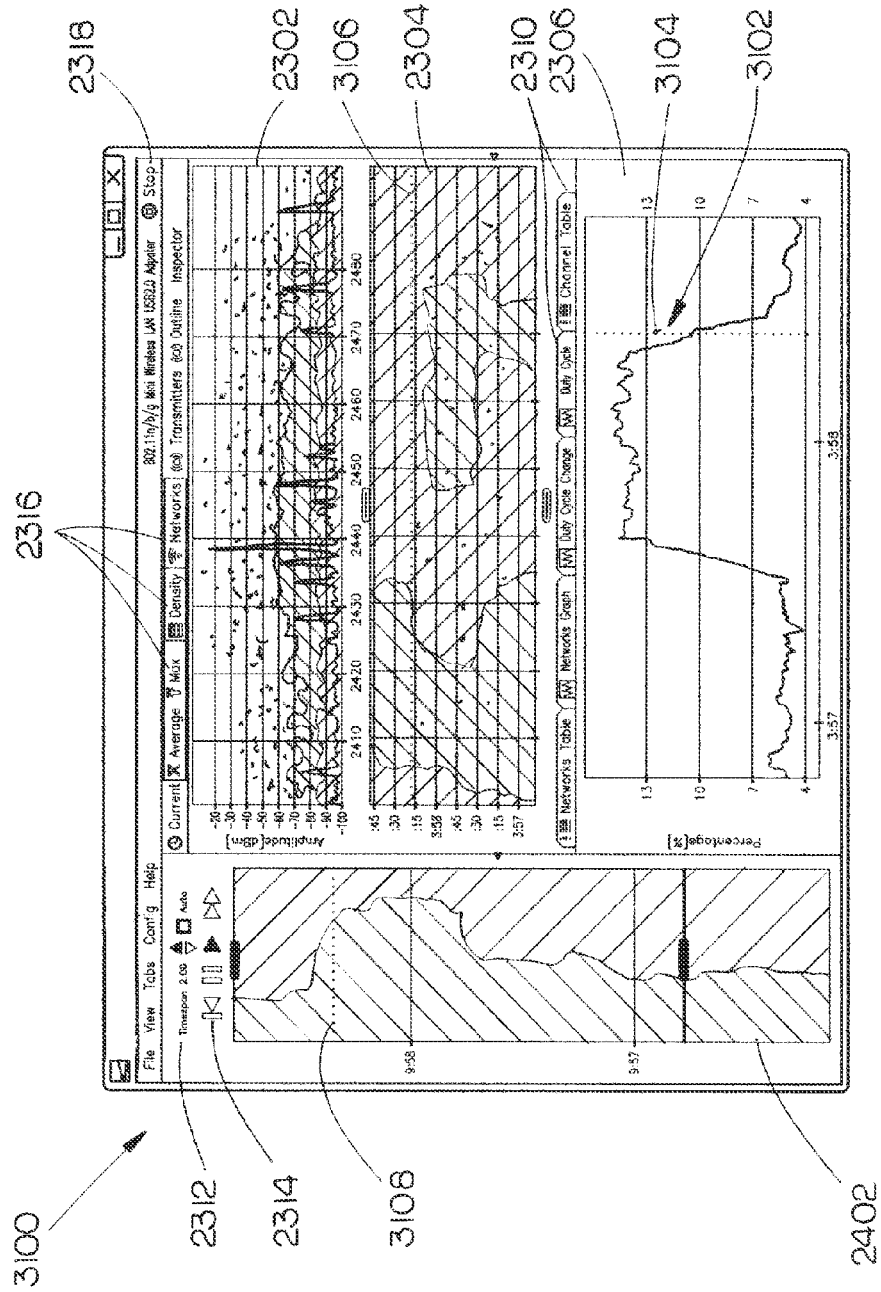
FIG. 31 is an additional illustration of an analysis of detected frequency spectrum data displayable by a user interface system.

FIG. 31 is an additional illustration 3100 of an analysis of detected frequency spectrum data displayable by a user interface system 200. User interface system 200 may provide a visual indication of a cursor on two or more graphs having at least one of the same axis. For example, in FIG. 31 image a cursor 3102 (e.g., arrow or other cursor indicator may be hovering over a point 3104 on a duty change graph 2306, which may display a duty cycle change (e.g., as a percentage) and also include a time axis. The spectrum waterfall graph 2304 and playback waterfall graph 2402 may also include a time axis. User interface system may generate a visual indication (e.g., a dotted line) at the point in time marked by the cursor 3102 on the duty cycle change graph 2306 (e.g., 3106 and 3108). A frequency marker may similarly highlight a radio frequency signal marked by the cursor if the cursor was positioned over a graph including a frequency axis, and so on.

Figure 32:
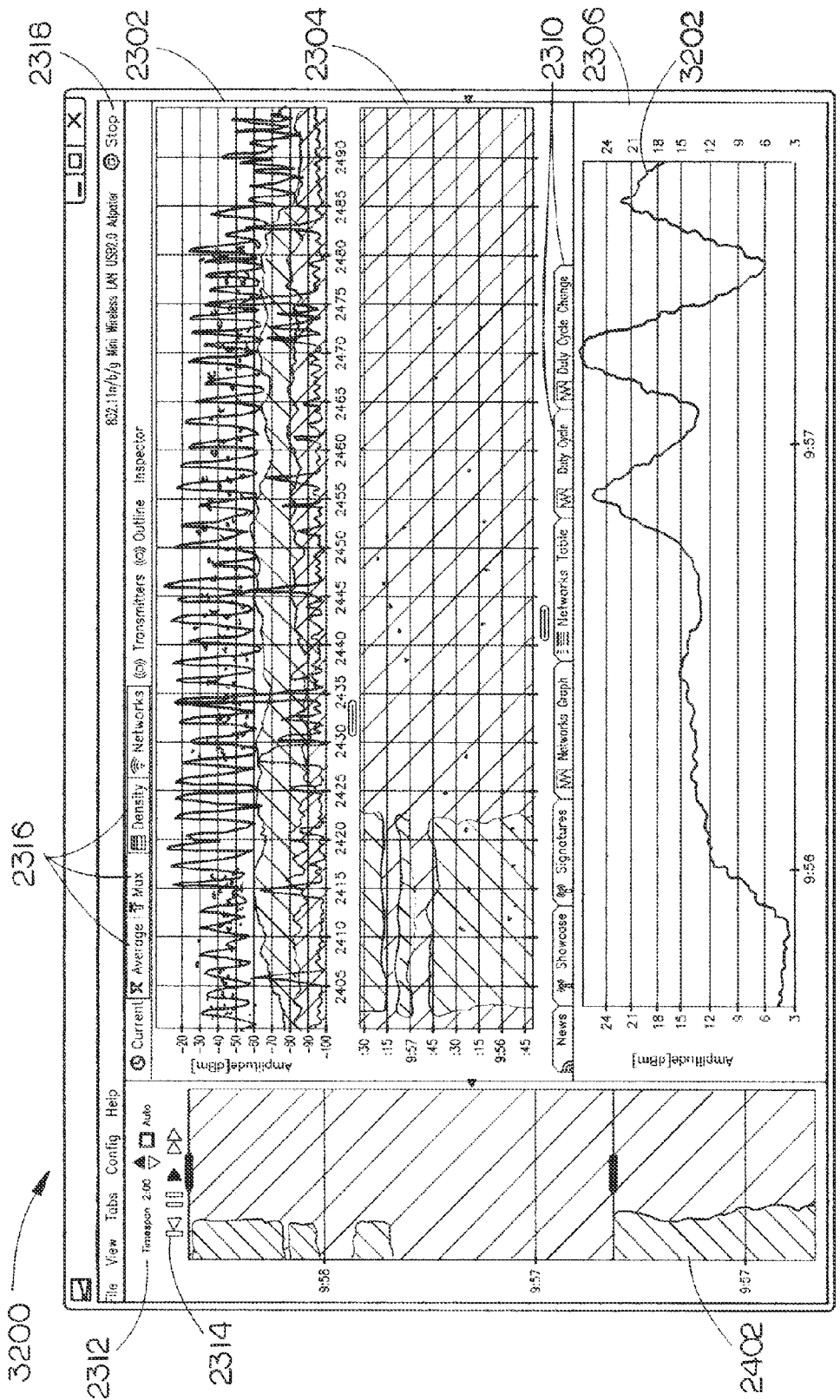
FIG. 32 is an additional illustration of an analysis of detected frequency spectrum data displayable by a user interface system.

FIG. 32 is an additional illustration 3200 of an analysis of detected frequency spectrum data displayable by a user interface system 200. User interface system 200 may compute a change in duty cycle across a monitored frequency band. FIG. 32 displays an average change in duty cycle over time 3202. The change in duty cycle may be substantially consistent during constant phases of the wireless environment and may increase or decrease when a change in detected frequency information occurs. Changes may include a new transmitter, a previous transmitter stopping transmission, a transmitter switching frequencies, etc. The duty cycle change 2302 may then be displayed in a graph 2306 so a viewer may visually determine when a change to the wireless environment has occurred. The computation may also be utilized to trigger additional events in the application, such as marking when a change has occurred and allowing a user to jump to a previous or next change in order to quickly review a spectrum analyzer file without requiring a playback of one or more sections of the file not displaying a change in the wireless environment.

User interface system may also display a waterfall graph using duty cycle information. Waterfall graph including duty cycle information may include a time axis and a frequency axis. Duty cycle information may be displayed utilizing a color spectrum (similar to embodiments above). Waterfall duty cycle view may provide historical data of a change in the duty cycle.

Systems, methods and apparatuses provide herein described an improved graphical user interface for spectrum, frequency and channel analysis and improved spectrum, frequency, and channel analysis. In this regard, the present invention may be described herein in terms of functional block components and various processing steps. It should be appreciated that such functional blocks may be realized by any number of hardware, firmware, and/or software components configured to perform the specified functions. For example, the present invention may employ various integrated circuit components, e.g., memory elements, digital signal processing elements, look-up tables, and the like, which may carry out a variety of functions under the control of one or more microprocessors or other control devices. Such general techniques and components that are known to those skilled in the art are not described in detail herein.

Various embodiments of the present invention include one or more techniques described below relating to improved spectrum and channel analysis and display. Each of these techniques may be implemented using standard user interface techniques, such as standard graphical software programming or the like. Of course any programming language or environment could be used to implement the techniques described herein.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is utilized to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages.

What is claimed:

1. A computer program product stored on a non-transitory computer readable medium usable with a programmable computer, the computer program product having computer-readable code embodied therein for displaying data in a graphical format, the computer-readable code comprising instructions for:
   mapping a range of detected densities of detected frequency signals to a corresponding range of color hues;
   generating a spectrum density graph displaying the detected frequency signals and corresponding densities as represented by the mapped corresponding range of color hues; and
   generating a waterfall spectrum graph displaying the corresponding detected densities utilizing the same color mapping of the detected range of densities of detected frequency signals as utilized by the generated spectrum density graph, thereby providing a density color match between data points on the spectrum density graph and the waterfall spectrum graph.

2. The computer program product of claim 1, wherein the mapping a range of detected densities of detected frequency signals to a corresponding range of color hues includes:
   mapping a blue hue to a low density value.

3. The computer program product of claim 1, wherein the mapping a range of detected densities of detected frequency signals to a corresponding range of color hues includes:
   mapping a red hue to a high density value.

4. The computer program product of claim 1, wherein the mapping a range of detected densities of detected frequency signals to a corresponding range of color hues includes:
   mapping a range of hues including green, yellow and orange hues to a range of density values between the high density value and the low density value.

5. The computer program product of claim 1, wherein the mapping a range of detected densities of detected frequency signals to a corresponding range of color hues includes:
   mapping one or more colors to a hue saturation value (HSV) color model.

6. The computer program product of claim 5, wherein the mapping one or more colors to a hue saturation value (HSV) color model includes:
   setting a saturation value to a fixed value.

7. The computer program product of claim 5, wherein the mapping one or more colors to a hue saturation value (HSV) color model includes:
   mapping amplitude to a hue in the spectrum waterfall display.

8. The computer program product of claim 5, wherein the mapping one or more colors to a hue saturation value (HSV) color model includes:
   mapping at least one amplitude to a hue in a corresponding spectrum density graph display.

9. The computer program product of claim 5, wherein the mapping one or more colors to a hue saturation value (HSV) color model includes:
   mapping a frequency spectrum density a value or a saturation.

10. The computer program product of claim 1, wherein the mapping a range of detected densities of detected frequency signals to a corresponding range of color hues includes:
    mapping a density to an alpha value.

11. The computer program product of claim 1, further including:
    providing an overlay of a device classification onto a visual representation of captured spectrum data for to allow a visual determination of device classification accuracy.

12. The computer program product of claim 1, further including:
    generating and displaying a playback waterfall graph display having selectable regions capable of providing a detailed display of one or more selected timespans of captured or collected spectrum data.

13. The computer program product of claim 12, further including:
    positioning the playback waterfall graph display within a side region of a display screen, such that a main viewing area of the display may display a current timespan of captured or collected spectrum data.

14. The computer program product of claim 12, further including:
    compressing the playback waterfall graph display as appropriate to maintain a constant size of the playback waterfall graph display within the viewing area of the display.

15. The computer program product of claim 14, further including:
    scaling the playback waterfall graph display as an image.

16. The computer program product of claim 14, further including:
    compressing the captured or collected spectrum data represented in the playback waterfall graph display.

17. The computer program product of claim 1, further including:
    generating and displaying one or more user selectable thumbnail versions of points in time of captured frequency spectrum data.

18. The computer program product of claim 17, further including:
    generating and displaying one or more side or border embellishments having a visual appearance of a film strip along a border region of the one or more user selectable thumbnail versions of points in time of captured frequency spectrum data.

19. The computer program product of claim 17, further including:
    generating and displaying a pop-up or pop-out version of the one or more user selectable thumbnail versions of points in time of captured frequency spectrum data, the pop-up or pop-out version viewable when a selection tool hovers over a portion of the graphical display.

20. The computer program product of claim 1, further including:
    generating and displaying an enhanced duty cycle display for one or more amplitude levels.

21. The computer program product of claim 20, further including:
    generating and displaying a duty cycle for each amplitude level on a color scale;
    generating and displaying duty cycle information from detected frequency spectrum information; and
    generating and displaying density information utilizing the color scale.

22. The computer program product of claim 21, wherein the generating and displaying density information utilizing the color scale further includes:
    incorporating density information for each frequency amplitude point into a coloration of the duty cycle, further including:
        mapping of the duty cycle with the frequency at each amplitude onto the a designated hue and the density at a corresponding frequency or amplitude point onto a designated color value.

23. The computer program product of claim 1, further including:
   providing a visual indication of a cursor on two or more graphs having at least one common axis.

24. The computer program product of claim 23, further including:
   generating and displaying a visual indication of a cursor location on at least a second graph at a point marked by the cursor on a first graph.

25. The computer program product of claim 1, further including:
   determining a duty cycle change across a monitored frequency band; and
   generating and displaying the duty cycle change.

* * * * *